United States Patent
Watanabe

(10) Patent No.: US 9,067,401 B2
(45) Date of Patent: *Jun. 30, 2015

(54) PROCESS FOR MAKING LITHOGRAPHIC PRINTING PLATE AND LITHOGRAPHIC PRINTING PLATE

(75) Inventor: Noriaki Watanabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 453 days.

This patent is subject to a terminal disclaimer.

(21) Appl. No.: 13/049,288

(22) Filed: Mar. 16, 2011

(65) Prior Publication Data

US 2011/0226145 A1    Sep. 22, 2011

(30) Foreign Application Priority Data

Mar. 18, 2010  (JP) .................................. 2010-063126
Mar. 29, 2010  (JP) .................................. 2010-074186

(51) Int. Cl.
*G03F 7/00* (2006.01)
*B41C 1/10* (2006.01)
*G03F 7/32* (2006.01)

(52) U.S. Cl.
CPC .............. *B41C 1/1008* (2013.01); *G03F 7/322* (2013.01); *B41C 2210/02* (2013.01); *B41C 2210/06* (2013.01); *B41C 2210/24* (2013.01); *B41C 1/1016* (2013.01); *B41C 2201/06* (2013.01); *B41C 2201/10* (2013.01); *B41C 2210/14* (2013.01); *B41C 2210/22* (2013.01); *B41C 2210/262* (2013.01); *B41C 2210/266* (2013.01)

(58) Field of Classification Search
USPC .......... 430/270.1, 306; 101/450.1, 453, 463.1
See application file for complete search history.

(56) References Cited

U.S. PATENT DOCUMENTS 7,175,967 B1    2/2007  Mulligan et al.
2008/0035000 A1*  2/2008  Miyamoto et al. ............ 101/457
(Continued)

FOREIGN PATENT DOCUMENTS

CN    101076758 A    11/2007
CN    101526734 A    9/2009
(Continued)

OTHER PUBLICATIONS

Office Action dated Jun. 18, 2013 in Japanese Application No. 2010-074186.
(Continued)

*Primary Examiner* — Chanceity Robinson
(74) *Attorney, Agent, or Firm* — Sughrue Mion, PLLC

(57) ABSTRACT

A process for making a lithographic printing plate that includes in sequence an exposure step of imagewise exposing by means of an infrared laser a lithographic printing plate precursor that has provided above a support a positive-working recording layer including (Component A) a (meth)acrylonitrile-derived monomer unit- and styrene-derived monomer unit-containing copolymer, (Component B) a water-insoluble and alkali-soluble resin, and (Component C) an infrared absorbing agent and a development step of developing, using an aqueous alkali solution including a betaine-based surfactant or a nonionic surfactant, the aqueous alkali solution having a pH of 8.5 to 10.8, by removing an exposed area of the positive-working recording layer whose solubility in aqueous alkali solution has been increased by the exposure. There is also provided a lithographic printing plate made by the process for making a lithographic printing plate.

21 Claims, 1 Drawing Sheet

(56) References Cited

U.S. PATENT DOCUMENTS

| | | | |
|---|---|---|---|
| 2009/0148793 A1* | 6/2009 | Adachi et al. | 430/302 |
| 2011/0011291 A1* | 1/2011 | Hotate et al. | 101/463.1 |
| 2011/0146516 A1* | 6/2011 | Kawauchi et al. | 101/453 |
| 2011/0200943 A1* | 8/2011 | Aoshima | 430/302 |

FOREIGN PATENT DOCUMENTS

| | | | |
|---|---|---|---|
| JP | 11-218914 A | | 8/1999 |
| JP | 2003-084430 A | | 3/2003 |
| JP | 2008-064959 A | | 3/2008 |
| JP | 2009237555 A | * | 10/2009 |
| WO | 2010/021364 A1 | | 2/2010 |

OTHER PUBLICATIONS

Office Action dated Jan. 13, 2014 in Chinese Application No. 201110068851.6.

* cited by examiner

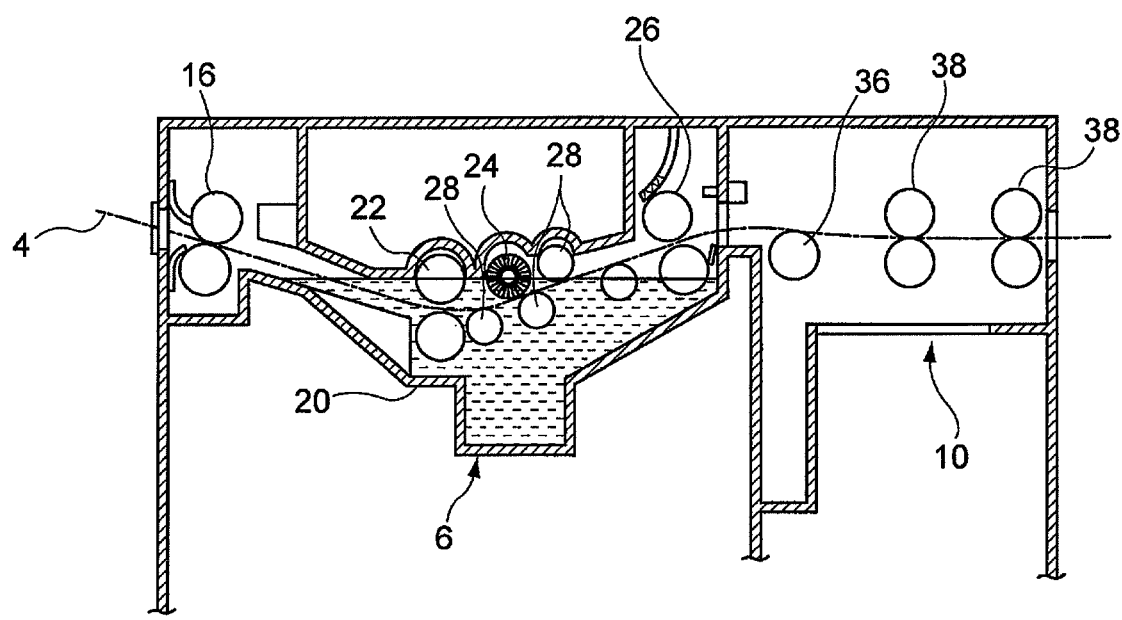

PROCESS FOR MAKING LITHOGRAPHIC PRINTING PLATE AND LITHOGRAPHIC PRINTING PLATE

BACKGROUND OF THE INVENTION

1. Field of the Invention

The present invention relates to a process for making a lithographic printing plate and a lithographic printing plate.

2. Description of Related Art

In a process for making a lithographic printing plate, after the exposure, a step of removing unnecessary image recording layer by dissolving, for example, with a developer is required, but from the viewpoint of the environment and safety carrying out, processing with a developer that is closer to neutral is desired. In particular, since in recent years the disposal of liquid waste discharged accompanying wet treatment has become a great concern throughout the industrial world from the viewpoint of consideration for the global environment.

On the other hand, digitization techniques involving electronically processing, storing, and outputting image information by computer have been widespread in recent years, and various new image output methods responding to such digitization techniques have been put into practical use. Accompanying this, a computer-to-plate (CTP) technique has been attracting attention in which digitized image information is carried on a highly convergent radiant ray such as laser light and a lithographic printing plate precursor is scan-exposed by this light to directly produce a lithographic printing plate without intervention of a lith film. A lithographic printing plate precursor for CTP is described in JP-A-H11-218914 (JP-A denotes a Japanese unexamined patent application publication) and JP-A-2003-84430.

SUMMARY OF THE INVENTION

It is an object of the present invention to provide a process for making a lithographic printing plate that enables the generation of development residue when processing a large amount to be suppressed and enables development of an aged lithographic printing plate precursor to be carried out stably, and a lithographic printing plate made by the above-mentioned making process.

The object of the present invention has been attained by means described in (1) and (20). It is described below together with (2) to (19), which are preferred embodiments.

(1) A process for making a lithographic printing plate, comprising in sequence: an exposure step of imagewise exposing by means of an infrared laser a lithographic printing plate precursor that has provided above a support a positive-working recording layer comprising (Component A) a (meth)acrylonitrile-derived monomer unit- and styrene-derived monomer unit-containing copolymer, (Component B) a water-insoluble and alkali-soluble resin, and (Component C) an infrared absorbing agent; and a development step of developing, using an aqueous alkali solution comprising a betaine-based surfactant or a nonionic surfactant, the aqueous alkali solution having a pH of 8.5 to 10.8, by removing an exposed area of the positive-working recording layer whose solubility in aqueous alkali solution has been increased by the exposure, (2) the process for making a lithographic printing plate according to (1), wherein the betaine-based surfactant comprises a compound represented by Formula <1> and/or a compound represented by Formula <2>

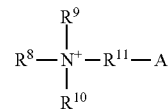

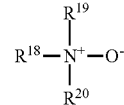

(in Formula <1>, $R^8$ denotes an alkyl group having 1 to 24 carbon atoms, $R^9$ and $R^{10}$ independently denote a hydrogen atom or an alkyl group having 1 to 24 carbon atoms, $R^{11}$ denotes an alkylene group having 1 to 24 carbon atoms, and A denotes a carboxylate ion or a sulfonate ion, and in Formula <2>, $R^{18}$, $R^{19}$, and $R^{20}$ independently denote a hydrogen atom or an alkyl group having 1 to 24 carbon atoms provided that not all of $R^{18}$, $R^{19}$, and $R^{20}$ are hydrogen atoms), (3) the process for making a lithographic printing plate according to (1) or (2), wherein the betaine-based surfactant comprises at least one of the compounds represented by Formula (W-1) to Formula (W-10),

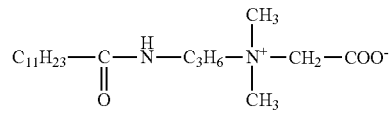

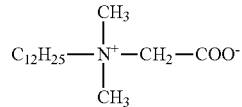

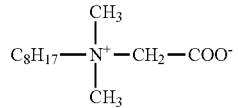

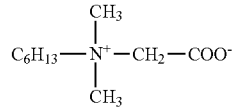

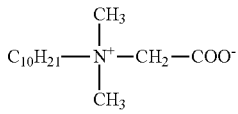

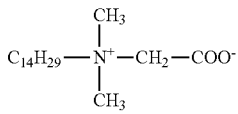

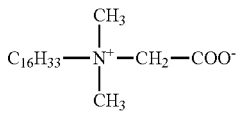

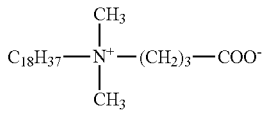

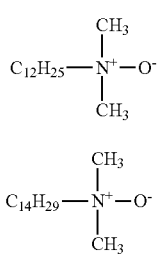

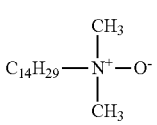

(4) the process for making a lithographic printing plate according to (1), wherein the nonionic surfactant comprises a nonionic aromatic ether-based surfactant, (5) the process for making a lithographic printing plate according to (1) or (4), wherein the nonionic surfactant comprises a compound represented by Formula (1-A) and/or Formula (1-B)

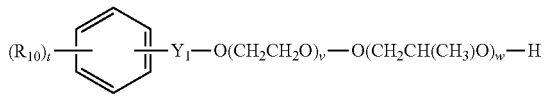

(in the Formulae (1-A) and (1-B), $R_{10}$ and $R_{20}$ independently denote an organic group having 1 to 100 carbon atoms; t and u independently denote 0, 1, or 2; $Y_1$ and $Y_2$ independently denote a single bond or an alkylene group having 1 to 10 carbon atoms; v and w independently denote an integer of 0 or 1 to 100 provided that v and w are not simultaneously 0 and when either v or w is 0 v and w are not 1, v' and w' independently denote an integer of 0 or 1 to 100 provided that v' and W are not simultaneously 0 and when either v' or w' is 0 v' and w' are not 1; when t denotes 2 and $R_{10}$ is an organic group having 1 to 100 carbon atoms, the $R_{10}$s may be identical to or different from each other, and the $R_{10}$s may together form a ring, and when u denotes 2 and $R_{20}$ is an organic group having 1 to 100 carbon atoms, the $R_{20}$s may be identical to or different from each other, and the $R_{20}$s may together form a ring.), (6) the process for making a lithographic printing plate according to any one of (1) to (5), wherein the aqueous alkali solution comprises a combination of carbonate ion and bicarbonate ion, (7) the process for making a lithographic printing plate according to any one of (1) to (6), wherein the development step is a step of carrying out development and gumming with a single bath, (8) the process for making a lithographic printing plate according to any one of (1) to (7), wherein the aqueous alkali solution does not comprise a water-soluble polymer compound, (9) the process for making a lithographic printing plate according to any one of (1) to (8), wherein a water washing step is not carried out either before or after the development step,

(10) the process for making a lithographic printing plate according to any one of (1) to (9), wherein the positive-working recording layer is a layer comprising an upper layer comprising the above Component A and a lower layer comprising the above Component B and the above Component C,

(11) the process for making a lithographic printing plate according to (10), wherein the upper layer further comprises an alkali-soluble resin,

(12) the process for making a lithographic printing plate according to any one of (1) to (11), wherein the alkali-soluble resin is selected from the group consisting of an alkali-soluble polyurethane resin, an alkali-soluble phenolic resin, and an alkali-soluble resin having a urea bond in a side chain,

(13) the process for making a lithographic printing plate according to (10) or (11), wherein the above Component A has a content of 10 to 80 wt % relative to the total solids content by weight of the upper layer excluding volatile components,

(14) the process for making a lithographic printing plate according to (10), (11), or (13), wherein the above Component B has a content of 20 to 98 wt % relative to the total solids content by weight of the lower layer excluding volatile components,

(15) the process for making a lithographic printing plate according to (10), (11), (13) or (14), wherein the above Component C has a content of 0.01 to 50 wt % relative to the total solids content by weight of the lower layer excluding volatile components,

(16) the process for making a lithographic printing plate according to any one of (1) to (15), wherein the proportion of the (meth)acrylonitrile-derived monomer unit in the above Component A is 10 to 40 mole %, and the proportion of the styrene-derived monomer unit is 55 to 85 mole %,

(17) the process for making a lithographic printing plate according to any one of (1) to (16), wherein the above Component B is a copolymer comprising an N-substituted maleimide-derived monomer unit, a (meth)acrylamide-derived monomer unit, and a (meth)acrylic acid-derived monomer unit,

(18) the process for making a lithographic printing plate according to any one of (1) to (17), wherein the above Component C is a cyanine dye,

(19) the process for making a lithographic printing plate according to any one of (1) to (18), wherein the aqueous alkali solution comprises an organic acid and/or an organic acid salt, and

(20) a lithographic printing plate made by the process for making a lithographic printing plate according to any one of (1) to (19).

BRIEF DESCRIPTION OF DRAWING

FIG. 1 is an explanatory diagram showing the structure of an automatic processor.

DETAILED DESCRIPTION OF THE INVENTION

The process for making a lithographic printing plate of the present invention comprises in sequence an exposure step of imagewise exposing a positive-working lithographic printing plate precursor for infrared laser that has provided above a support a positive-working recording layer comprising (Component A) a (meth)acrylonitrile-derived monomer unit- and styrene-derived monomer unit-containing copolymer, (Component B) a water-insoluble and alkali-soluble resin, and (Component C) an infrared absorbing agent, the positive-working recording layer having a solubility in aqueous alkali solution that increases upon exposure or heating and a development step of developing using an aqueous alkali solution comprising a betaine-based surfactant or a nonionic surfactant, the aqueous alkali solution having a pH of 8.5 to 10.8. The notation 'A to B' etc., which expresses a numerical range, has the same meaning as 'at least A but no greater than B', and the same applies below. In the present specification, the expression '(meth)acrylate', etc. means 'acrylate and methacrylate' etc., and the same applies below.

Each constituent of the lithographic printing plate precursor used in the present invention is first explained below and the process for making a lithographic printing plate of the present invention is then explained.

I. Positive-working Lithographic Printing Plate Precursor for Infrared Laser Positive-working Recording Layer The positive-working lithographic printing plate precursor for infrared laser of the present invention (hereinafter, also called a 'lithographic printing plate precursor') is a lithographic printing plate precursor that has provided above a support a positive-working recording layer (hereinafter, also called simply a 'recording layer') comprising (Component A) an acrylonitrile-derived monomer unit- and styrene-derived monomer unit-containing copolymer, (Component B) a water-insoluble and alkali-soluble resin, and (Component C) an infrared absorbing agent, the positive-working recording layer having a solubility in an alkaline developer that increases upon exposure or heating.

The recording layer is preferably a layer comprising an upper layer comprising at least the above Component A and a lower layer comprising at least the above Component B and the above Component C. Each component contained in the upper layer and the lower layer is explained below.

Upper Layer

In an unexposed area (that is, an image area), the upper layer protects the lower layer from a developer. The upper layer is insoluble in an alkaline developer before image formation (that is, before being imagewise exposed). However, an area of the upper layer that has been exposed becomes removable by a developer after thermal exposure (that is, thermal imaging). While not being bound to any theory or explanation, it is believed that due to imagewise exposure the upper layer more easily dissolves or disperses in a developer and/or the adhesion between the upper layer and the lower layer is weakened. This enables the developer to permeate through the upper layer and the lower layer, the lower layer is dissolved, and the surface of the support appears. The components contained in the upper layer are explained below.

(Component A) (Meth)Acrylonitrile-derived Monomer Unit- and Styrene-derived Monomer Unit-containing Copolymer In the present invention, the lithographic printing plate precursor comprises a positive-working recording layer comprising Component A. When the positive-working recording layer comprises the upper layer and the lower layer, it is preferable for Component A to be contained in the upper layer.

Component A may be insoluble in an aqueous alkaline developer. It is thought that in exposed areas a developer permeates through the upper layer, and when the lower layer is dissolved or dispersed in these areas, the upper layer and the lower layer are removed and dispersed in the developer.

From the viewpoint of development residue, the (meth)acrylonitrile as a monomer unit of Component A is preferably acrylonitrile.

The styrene as the styrene-derived monomer unit may employ not only styrene monomer but also a styrene derivative having at least one substituent. Examples of the substituent include a halogen atom (an F atom, a Cl atom, a Br atom, an I atom), an alkyl group having 1 to 12 carbon atoms, an oxyalkylene group having 1 to 12 carbon atoms, and an aryl group having 6 to 10 carbon atoms.

Specific examples of styrene and the styrene derivative include styrene, o-methylstyrene, m-methylstyrene, p-methylstyrene, p-methoxystyrene, p-phenylstyrene, p-chlorostyrene, p-ethylstyrene, p-n-butylstyrene, p-tert-butylstyrene, p-n-hexylstyrene, p-n-octylstyrene, p-n-nonylstyrene, p-n-decylstyrene, p-n-dodecylstyrene, 2,4-dimethylstyrene, and 3,4-dichlorostyrene, and among them styrene is preferable.

Component A may be copolymerized with, as another component, a third component monomer other than styrene or acrylonitrile. The third component is preferably an alkali-soluble group-containing ethylenically unsaturated monomer. Such an ethylenically unsaturated monomer includes, in addition to acrylic acid and methacrylic acid, compounds represented by the formulae below and mixtures thereof. In the formulae, R denotes a hydrogen atom or a methyl group. In the formulae, —OH, —SO$_2$NH$_2$, or —COOH bonded to a phenyl group may be bonded to any position of the phenyl group.

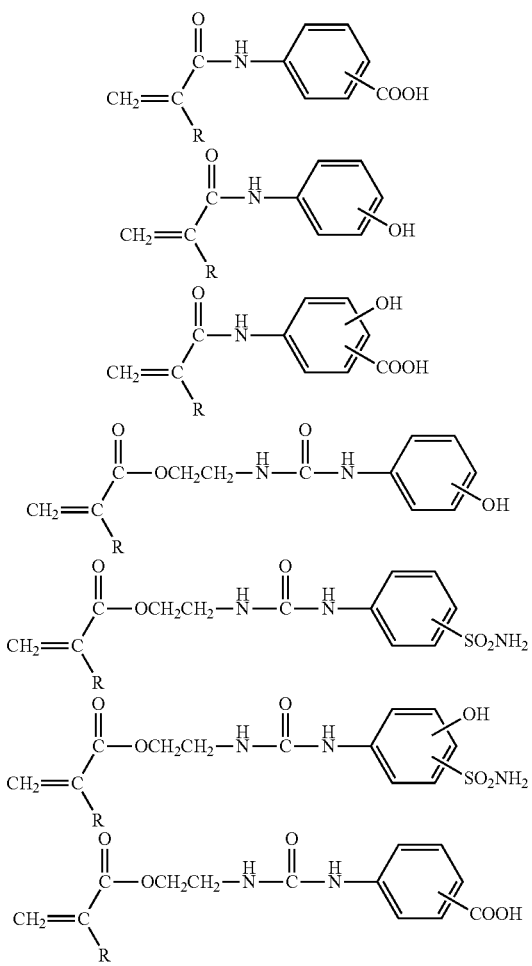

In the present invention, the third component is preferably (meth)acrylic acid, and more preferably methacrylic acid.

From the viewpoint of development residue, the proportion of the (meth)acrylonitrile-derived monomer unit in Component A is preferably 10 to 40 mole %, more preferably 15 to 35 mole %, and yet more preferably 20 to 30 mole %.

From the viewpoint of ink laydown properties, the proportion of the styrene-derived monomer unit in Component A is preferably 55 to 85 mole %, more preferably 60 to 80 mole %, and yet more preferably 65 to 75 mole %.

The proportion of the third component-derived monomer unit in Component A is preferably no greater than 15 mole %, more preferably no greater than 10 mole %, and yet more preferably no greater than 6 mole %.

The weight-average molecular weight of Component A is preferably 1,000 to 1,000,000, more preferably 3,000 to 300,000, and yet more preferably 10,000 to 50,000.

The content of Component A in the recording layer relative to the total solids content by weight of the recording layer excluding volatile components is preferably 5 to 70 wt %, more preferably 20 to 55 wt %, and yet more preferably 35 to 45 wt %.

The content of Component A in the upper layer relative to the total solids content by weight of the upper layer excluding volatile components is preferably 10 to 80 wt %, more preferably 40 to 75 wt %, and yet more preferably 60 to 70 wt %.

A resin other than Component A may be added to the upper layer, and examples thereof include a (meth)acrylic polymer and copolymer; polystyrene; a styrene/acrylic copolymer; polyester; polyamide; polyurea; polyurethane; nitrocellulose; an epoxy resin; and a mixture thereof.

Alkali-soluble Resin

The recording layer preferably comprises an alkali-soluble resin other than Component B. In particular, when the recording layer is multilayered and comprises an upper layer and a lower layer, it is preferable for the upper layer to comprise an alkali-soluble resin. Examples of such an alkali-soluble resin include an alkali-soluble polyurethane resin, an alkali-soluble phenolic resin, and an alkali-soluble resin having a urea bond in a side chain.

The alkali-soluble polyurethane resin used in the present invention is preferably a polyurethane resin having a carboxyl group in the polymer main chain, and specific examples thereof include a polyurethane resin having as a basic skeleton a reaction product between a diisocyanate compound represented by Formula (I) below and diol compound having a carboxyl group represented by Formula (II) or Formula (III) below.

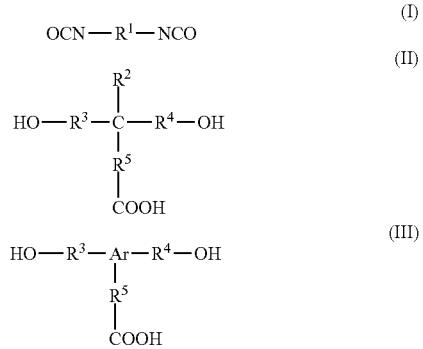

In Formula (I), $R^1$ denotes a divalent hydrocarbon group. Preferred examples of $R^1$ include an alkylene group having 2 to 10 carbon atoms and an arylene group having 6 to 30 carbon atoms. $R^1$ may have as a substituent another functional group that does not react with an isocyanate group.

In Formula (II), $R^2$ denotes a hydrogen atom or a hydrocarbon group. Preferred examples of $R^2$ include a hydrogen atom, an unsubstituted alkyl group having 1 to 8 carbon atoms, and an unsubstituted aryl group having 6 to 15 carbon atoms.

In Formula (II) and Formula (III), $R^3$, $R^4$, and $R^5$ independently denote a single bond or a divalent linking group. Examples of the divalent linking group include an aliphatic hydrocarbon group and an aromatic hydrocarbon group; an unsubstituted alkylene group having 1 to 20 carbon atoms and an unsubstituted arylene group having 6 to 15 carbon atoms are preferable, and an unsubstituted alkylene group having 1 to 8 carbon atoms is more preferable.

In Formula (III), Ar denotes a trivalent aromatic hydrocarbon group, and preferably denotes a trivalent aromatic hydrocarbon group having 6 to 15 carbon atoms.

$R^1$ to $R^5$ and Ar may have a substituent that does not react with the isocyanate group.

Specific examples of the diisocyanate compound represented by Formula (I) include aromatic diisocyanate compounds such as 2,4-tolylene diisocyanate, 2,4-tolylene diisocyanate dimer, 2,6-tolylene diisocyanate, p-xylylene diisocyanate, metaxylylene diisocyanate, 4,4'-diphenylmethane diisocyanate, 1,5-naphthylenediisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and dimer acid diisocyanate; alicyclic diisocyanate compounds such as isophorone diisocyanate, 4,4'-methylenebis(cyclohexyl isocyanate), methylcyclohexane-2,4-(or -2,6-)diisocyanate, and 1,3-(isocyanatomethyl)cyclohexane; and diisocyanate compounds that are products of a reaction between a diol and a diisocyanate, such as an adduct of 1 mol of 1,3-butylene glycol and 2 mol of tolylene diisocyanate. Among them, one having an aromatic ring such as 4,4'-diphenylmethane diisocyanate, xylylene diisocyanate, or tolylene diisocyanate is preferable from the viewpoint of scratch resistance.

Furthermore, specific examples of a carboxyl group-containing diol compound represented by Formula (II) or (III) include 3,5-dihydroxybenzoic acid, 2,2-bis(hydroxymethyl) propionic acid, 2,2-bis(hydroxyethyl)propionic acid, 2,2-bis(3-hydroxypropyl)propionic acid, 2,2-bis(hydroxymethyl) acetic acid, bis(4-hydroxyphenyl)acetic acid, 4,4-bis(4-hydroxyphenyl)pentanoic acid, and tartaric acid. Among them, 2,2-bis(hydroxymethyl)propionic acid and 2,2-bis(hydroxyethyl)propionic acid are preferable from the viewpoint of reactivity with an isocyanate.

The polyurethane resin may be synthesized by heating the above-mentioned diisocyanate compound and diol compound in an aprotic solvent with added thereto a known catalyst having activity required for the reactivities thereof.

The molar ratio of the diisocyanate compound and the diol compound used is preferably 0.8:1 to 1.2:1, and when an isocyanate group remains on the terminus of the polymer, by treating it with an alcohol or an amine, etc., the polymer can finally be synthesized in a form in which there are no remaining isocyanate groups.

The weight-average molecular weight of the polyurethane resin is preferably 1,000 or greater, and more preferably in the range of 5,000 to 100,000. These polyurethane resins may be used singly or in a combination of two or more types.

The alkali-soluble phenolic resin is preferably for example an alkali-soluble novolac resin. Examples of the alkali-soluble novolac resin include alkali-soluble novolac resins such as a phenol formaldehyde novolac resin, a m-cresol formaldehyde novolac resin, a p-cresol formaldehyde novolac resin, a mixed m-/p-cresol formaldehyde novolac resin, and a mixed phenol/cresol (any of m-, p-, or mixed m-/p-) formaldehyde novolac resin. Furthermore, a condensate of formaldehyde and a phenol having as a substituent an alkyl group having 3 to 8 carbon atoms such as a t-butylphenol formaldehyde resin or an octylphenol formaldehyde resin may be used in combination.

The weight-average molecular weight of the alkali-soluble phenolic resin is preferably 500 to 20,000, more preferably 1,000 to 10,000, and yet more preferably 2,000 to 8,000.

The alkali-soluble resin having a urea bond in a side chain is preferably a polymer of a urea bond-containing acrylic monomer having a phenolic hydroxy group as a substituent, and examples thereof include a polymer of a compound represented by Formula (IV).

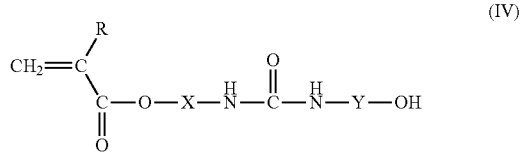

In Formula (IV), R denotes a hydrogen atom or an alkyl group. R is preferably a hydrogen atom or an alkyl group having 1 to 4 carbon atoms, and more preferably a hydrogen atom or a methyl group.

X denotes a divalent linking group, and examples thereof include an alkylene group or a phenylene group. X is preferably an alkylene group, more preferably a straight-chain or branched alkylene group having 1 to 10 carbon atoms, and yet more preferably an alkylene group having 1 to 4 carbon atoms.

Y denotes an optionally substituted divalent aromatic group, and examples thereof include an optionally substituted phenylene group or naphthylene group. Examples of the substituent include an alkyl group having 1 to 3 carbon atoms and an aryl group having 6 to 20 carbon atoms.

From the viewpoint of development latitude, the content of the monomer unit derived from a compound represented by Formula (IV) above in the alkali-soluble resin having a urea bond in a side chain, with the content of all monomer units of the alkali-soluble resin having a urea bond in a side chain as 100 mole %, is preferably 10 to 80 mole %, more preferably 15 to 70 mole %, and particularly preferably 20 to 60 mole %.

The polymer of the urea bond-containing monomer having a phenolic hydroxy group as a substituent is preferably a copolymer with a compound that has a polymerizable unsaturated bond and does not contain a urea bond, and the copolymer is preferably formed by copolymerization using a polymerizable monomer that does not contain a urea bond at 10 to 80 mole % when the number of all monomer units contained in the copolymer is 100 mole %.

Such a monomer is particularly preferably an N-phenylmaleimide derivative or a (meth)acrylic monomer having a sulfonamide group in a side chain. Examples of the N-phenylmaleimide derivative include N-phenylmaleimide, N-2-methylphenylmaleimide, N-2,6-diethylphenylmaleimide, N-2-chlorophenylmaleimide, and N-hydroxyphenylmaleimide.

Examples of the (meth)acrylic monomer having a sulfonamide group in a side chain include m-aminosulfonylphenyl (meth)acrylate, N-(p-aminosulfonylphenyl)(meth)acrylamide, and N-(p-aminosulfonylphenyl) (meth)acrylamide.

The weight-average molecular weight of the alkali-soluble resin having a urea bond in a side chain is preferably at least 2,000, and more preferably 3,000 to 500,000.

The number-average molecular weight is preferably at least 1,000, and more preferably 2,000 to 400,000.

As the alkali-soluble resin contained in the upper layer, an alkali-soluble polyurethane resin and an alkali-soluble phenolic resin are preferable, and an alkali-soluble polyurethane resin is more preferable.

The content of the alkali-soluble resin other than Component B in the recording layer relative to the total solids content by weight of the recording layer excluding volatile components is preferably no greater than 40 wt %, more preferably 10 to 35 wt %, and yet more preferably 15 to 30 wt %.

The content of the alkali-soluble resin other than Component B in the upper layer relative to the total solids content by weight of the upper layer excluding volatile components is preferably no greater than 50 wt %, more preferably 15 to 45 wt %, and yet more preferably 20 to 40 wt %.

Lower Layer

The lower layer of the recording layer is now explained. The lower layer preferably comprises (Component B) a water-insoluble and alkali-soluble resin and (Component C) an infrared absorbing agent. The lower layer is present between the upper layer and the support. After forming an image, the lower layer is removed together with the upper layer in an imaged area by means of an aqueous alkali solution, thus exposing the support underneath. The lower layer is preferably soluble in the aqueous alkali solution in order to prevent the generation of residue in a developer.

(Component B) Water-insoluble and Alkali-soluble Resin

The recording layer comprises (Component B) a water-insoluble and alkali-soluble resin.

Here, being 'water-insoluble' means that when the resin is applied to a recording layer of a positive-working photosensitive lithographic printing plate, it is insoluble in development under conditions of a developer temperature of 25° C. to 35° C., a developer pH of 6 to 8, and a time of 30 sec, and being 'alkali-soluble' means that it exhibits solubility when developed at a developer temperature of 25° C. to 35° C. and a developer pH of 8.5 to 10.8 for 60 sec.

When the recording layer comprises an upper layer and a lower layer, Component B may be contained in either the upper layer or the lower layer, but is preferably contained only in the lower layer.

Examples of the water-insoluble and alkali-soluble resin include an alkali-soluble acrylic resin and the alkali-soluble phenolic resin, and an alkali-soluble acrylic resin is preferable. As the alkali-soluble acrylic resin, a polymer formed by polymerization of a monomer mixture containing at least one acidic group-containing ethylenically unsaturated monomer is preferably used.

Examples of the acidic group-containing ethylenically unsaturated monomer include an alkali-soluble group-containing ethylenically unsaturated monomer that can be subjected to copolymerization as the third component in Component A. Among them, (meth)acrylic acid is preferable, and methacrylic acid is more preferable.

Since the developability is excellent, the content of the alkali solubility-imparting acidic group-containing ethylenically unsaturated monomer, with the monomer units contained in Component B being 100 mole %, is preferably 1 to 30 mole %, more preferably 5 to 25 mole %, and yet more preferably 10 to 20 mole %.

As a polymerizable monomer other than the acidic group-containing ethylenically unsaturated monomer, an alkyl (meth)acrylate, an aliphatic hydroxy group-containing (meth)acrylate ester, (meth)acrylamide, a vinyl ester, a styrene, a nitrogen atom-containing monomer such as N-vinylpyrrolidone, and a maleimide can be cited. Among these other polymerizable monomers, a (meth)acrylate ester, a (meth)acrylamide, a maleimide, and (meth)acrylonitrile are preferably used, and (meth)acrylamide and a maleimide are more preferably used.

As the maleimide, an N-substituted maleimide is preferable, and examples of the N-substituted maleimide include N-methylmaleimide, N-ethylmaleimide, N-n-propylmaleimide, N-i-propylmaleimide, N-n-butylmaleimide, N-t-butylmaleimide, N-n-hexylmaleimide, N-cyclopentylmaleimide, N-cyclohexylmaleimide, N-phenylmaleimide, and N-1-naphthylmaleimide. Among them, N-cyclohexylmaleimide and N-phenylmaleimide are preferable, and N-phenylmaleimide is more preferable. With regard to the N-substituted maleimide, one type thereof may be used on its own or two or more types thereof may be used in combination.

The content of the N-substituted maleimide-derived monomer unit, with the monomer units contained in Component B being 100 mole %, is preferably no greater than 75 mole %, more preferably 45 to 75 mole %, and yet more preferably 50 to 70 mole %.

Furthermore, Component B preferably comprises a (meth) acrylamide-derived monomer unit, and the content of the (meth)acrylamide-derived monomer unit, with the monomer units contained in Component B being 100 mole %, is preferably no greater than 40 mole %, more preferably 10 to 40 mole %, and yet more preferably 20 to 30 mole %.

The weight-average molecular weight of the alkali-soluble acrylic resin of Component B is preferably at least 2,000, more preferably 10,000 to 100,000, and yet more preferably 30,000 to 60,000.

Furthermore, the number-average molecular weight of Component B is preferably 500 to 250,000.

One with a dispersity (weight-average molecular weight/number-average molecular weight) of 1.1 to 10 is preferable.

The content of Component B in the recording layer relative to the total solids content by weight of the recording layer excluding volatile components is preferably 30 to 60 wt %, more preferably 35 to 55 wt %, and yet more preferably 40 to 50 wt %.

The content of Component B in the lower layer relative to the total solids content by weight of the lower layer excluding volatile components is preferably 20 to 98 wt %, more preferably 60 to 98 wt %, and yet more preferably 80 to 98 wt %.
(Component C) Infrared Absorbing Agent It is necessary to add (Component C) an infrared absorbing agent to the recording layer of the lithographic printing plate precursor. When the recording layer is multilayered, it is necessary to add it to a lower layer, and it may also be added to an upper layer. As Component C, various dyes known as infrared absorbing agents may be used.

As the infrared absorbing agent, known infrared absorbing agents may be used, specific examples thereof include dyes such as azo dyes, metal complex salt azo dyes, pyrazolone azo dyes, anthraquinone dyes, phthalocyanine dyes, carbonium dyes, quinonimine dyes, methine dyes, and cyanine dyes. In the present invention, among these dyes, one that absorbs at least infrared or near-infrared light is preferable since it is suitable for utilization with a laser that emits infrared or near-infrared light, and a cyanine dye is particularly preferable.

Examples of such a dye that absorbs at least infrared or near-infrared include cyanine dyes described in JP-A-58-125246, JP-A-59-84356, JP-A-59-202829, JP-A-60-78787, etc., methine dyes described in JP-A-58-173696, JP-A-58-181690, JP-A-58-194595, etc., naphthoquinone dyes described in JP-A-58-112793, JP-A-58-224793, JP-A-59-48187, JP-A-59-73996, JP-A-60-52940, JP-A-60-63744, etc., squarylium dyes described in JP-A-58-112792 etc., and cyanine dyes described in British Patent No. 434,875, etc.

Furthermore, as the dyes, there can also be appropriately used near-infrared-absorbing sensitizers described in U.S. Pat. No. 5,156,938 and, moreover, substituted arylbenzo(thio)pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063, and JP-A-59-146061, cyanine dyes described in JP-A-59-216146, pentamethinethiopyrylium salts, etc. described in U.S. Pat. No. 4,283,475, and pyrylium compounds, etc. as disclosed in JP-B-5-13514 and JP-B-5-19702, and as commercially available products, Epolight III-178, Epolight III-130, Epolight III-125, and the like manufactured by Epolin, Inc. are particularly preferably used.

Furthermore, other particularly preferable examples of dyes include near-infrared-absorbing dyes represented by Formulae (I) and (II) described in U.S. Pat. No. 4,756,993.

Among them, cyanine dye is preferable, and examples thereof include one represented by general formula (I) of JP-A-2001-305722 and compound described in paragraphs [0096] to [0103] of JP-A-2002-079772. Particularly preferred dye is cyanine dye A below.

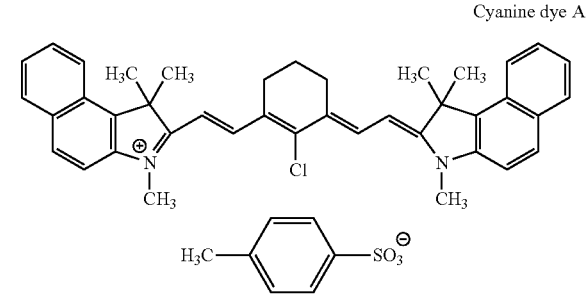

Cyanine dye A

The amount of infrared absorbing agent added to the lower layer is preferably 0.01 to 50 wt % relative to the total solids content of the lower layer, more preferably 0.1 to 30 wt %, and particularly preferably 1.0 to 30 wt %.

Furthermore, components of the lower layer in the present invention may comprise in combination another resin as long as the effects of the present invention are not impaired. Since the lower layer itself is required to dissolve or spread in developer in a non-image area (that is exposure area), it is necessary to select a resin that does not impair this property.

From this viewpoint, examples of the resin that can be used in combination include an alkali-soluble resin. Among them preferred examples include a polyamide resin, an epoxy resin, a polyacetal resin, an acrylic resin, a methacrylic resin, and a polystyrene-based resin.

The amount mixed is preferably no greater than 50 wt % relative to 100 wt % of the water-insoluble and alkali-soluble resin.
Other Additives When forming the recording layer comprising the lower layer and the upper layer, in addition to the above-mentioned components, various additives may be added as necessary as long as the effects of the present invention are not impaired.

The additives cited below may be added only to the lower layer, only to the upper layer, or to both layers.
Development Accelerator For the purpose of improving the sensitivity, an acid anhydride, a phenol, or an organic acid may be added to the upper layer and/or the lower layer.

The acid anhydride is preferably a cyclic acid anhydride, and specific examples of the cyclic acid anhydride, described in U.S. Pat. No. 4,115,128, include phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, α-phenylmaleic anhydride, succinic anhydride, and pyromellitic anhydride. As an acyclic acid anhydride, acetic anhydride, etc. can be cited.

Examples of the phenol include bisphenol A, 2,2-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane, etc.

As the organic acid, there are those described in JP-A-60-88942, JP-A-2-96755, etc., and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The ratio of the acid anhydride, phenol, and organic acid relative to the total solids content of the lower layer or the upper layer is preferably 0.05 to 20 wt %, more preferably 0.1 to 15 wt %, and particularly preferably 0.1 to 10 wt %.

Surfactant

For the purpose of improving the coating properties and enhancing the stability to treatment under development conditions, the upper layer and/or the lower layer may contain a nonionic surfactant described in JP-A-62-251740 and JP-A-3-208514, an amphoteric surfactant described in JP-A-59-121044 and JP-A-4-13149, or a copolymer of a fluorine-containing monomer described in JP-A-62-170950, JP-A-11-288093, and JP-A-2003-057820.

Specific examples of the nonionic surfactant include sorbitan tristearate, sorbitan monopalmitate, sorbitan trioleate, monoglycerol stearate, and polyoxyethylene nonyl phenyl ether.

Specific examples of the amphoteric surfactant include an alkyldi(aminoethyl)glycine, an alkylpolyaminoethylglycine hydrochloride, a 2-alkyl-N-carboxyethyl-N-hydroxyethylimidazolinium betaine, and an N-tetradecyl-N,N-betaine type (e.g. product name 'Amogen K': Dai-Ichi Kogyo Seiyaku Co., Ltd.).

The ratio of the surfactant relative to the total solids content of the lower layer or upper layer is preferably 0.01 to 15 wt %, more preferably 0.05 to 5 wt %, and yet more preferably 0.1 to 2.0 wt %.

Printing-out Agent/Colorant

The upper layer and/or the lower layer may contain a dye or a pigment as a printing-out agent or an image colorant to immediately form a visible image after the heating caused by exposure.

As a representative example of the printing-out agent, there can be cited a combination of a compound releasing an acid as a result of the heating caused by exposure (photo-acid generator) and a compound which can form a salt with the photo-acid generator (a salt-forming organic dye). Examples of the photo-acid generator include an o-naphthoquinonediazido-4-sulfonic acid halogenide, an oxazole-based compound, a triazine-based compound and a trihalomethyl compound.

In addition to the above-mentioned salt-forming organic dyes, another known dye may be used as the colorant. As well as the salt-forming organic dyes, oil-soluble dyes and basic dyes are suitable. There can be specifically cited Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo K. K.), Victoria Pure Blue, Crystal Violet Lactone, Crystal Violet (CI42555), Methyl Violet (CI42535), Ethyl Violet, Rhodamine B (CI145170B), Malachite Green (CI42000), Methylene Blue (CI52015), etc. Moreover, dyes described in JP-A-62-293247 are particularly preferable.

These dyes are preferably added at a ratio of 0.01 to 10 wt % relative to the total solids content of the lower layer or the upper layer, and more preferably at a ratio of 0.1 to 3 wt %.

Plasticizer

A plasticizer may be added to the upper layer and/or the lower layer in order to impart flexibility, etc. to the coating. Examples thereof include butylphthalyl polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

These plasticizers are preferably added at a ratio of 0.5 to 10 wt % relative to the total solids content of the lower layer or the upper layer, and more preferably at a ratio of 1.0 to 5 wt %.

Wax

For the purpose of imparting resistance to scratching, a compound that reduces the coefficient of static friction of the surface may be added to the upper layer. Specific examples thereof include compounds comprising esters of long chain alkylcarboxylic acids, such as those described in U.S. Pat. No. 6,117,913, JP-A-2003-149799, JP-A-2003-302750, or JP-A-2004-12770.

The amount thereof added as a proportion in the upper layer is preferably 0.1 to 10 wt %, and more preferably 0.5 to 5 wt %.

Formation of Lower Layer and Upper Layer

The lower layer and the upper layer of the lithographic printing plate precursor may usually be formed by dissolving the above-mentioned components in a solvent and coating an appropriate support therewith.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene, but are not limited thereto. These solvents may be used on their own or as a mixture.

The lower layer and the upper layer are in principle preferably formed as two separate layers. Examples of a method for forming two separate layers include a method in which a difference in solvent solubility between components contained in the lower layer and components contained in the upper layer is utilized and a method in which, after an upper layer is applied, the solvent is rapidly removed by drying. These methods are described in detail below, but the method for coating as two separate layers is not limited to these methods.

As the method in which a difference in solvent solubility between components contained in the lower layer and components contained in the upper layer is utilized, a solvent system in which all of the components contained in the lower layer are insoluble is used when applying an upper layer coating solution. This enables each layer to be formed in a clearly separated manner even when carrying out two-layer coating.

For example, as a solvent for the upper layer, 3-pentanone or propylene glycol monobutylether-2-acetate which dissolves alkali-soluble resin, an upper layer component, and does not dissolve a component of a lower layer is selected, and as a solvent for the lower layer, a solvent system which comprises as a main solvent γ-butyrolactone which dissolves components of the lower layer followed by coating and drying. Subsequently, making two layers is possible by dissolving an upper layer component mainly containing an alkali-soluble resin by 3-pentanone, or propylene glycol monomethylether-2-acetate, etc.

The method for very rapidly drying the solvent after a second layer (upper layer) is applied may be achieved by blowing high-pressure air via a slit nozzle placed at substantially right angles relative to the web travel direction, applying thermal energy as conductive heat from a lower face of a web using a roll having a heating medium such as steam supplied to the interior thereof (heating roll), or combining the above.

In order to impart a new function, the upper layer and the lower layer may proactively be made partially miscible in a range in which the effects of the present invention are sufficiently exhibited. As a method for carrying out the above, in the method utilizing a difference in solvent solubility and in the method in which the solvent is very rapidly dried after coating with a second layer, it may be carried out by adjusting the extent of the difference in solvent solubility or the extent of the rapid drying.

The concentration of the components, excluding solvent, in a lower layer/upper layer coating solution (the total solids content including additives) with which a support is coated is preferably 1 to 50 wt %.

As a method for coating, various methods may be used, and examples thereof include bar coater coating, spin coating, spray coating, curtain coating, dip coating, air knife coating, blade coating, and roll coating.

In particular, the upper layer coating method is preferably a non-contact method since it can prevent damage to the lower layer when applying the upper layer. Furthermore, although it is a contact method, it is possible to use bar coater coating as a method that is normally used for solvent system coating, and it is preferable to carry out coating in direct roll drive mode in order to prevent damage to the lower layer.

The dry coat weight of the lower layer component applied onto the support of the lithographic printing plate precursor is preferably in the range of 0.5 to 4.0 g/m$^2$, and more preferably in the range of 0.6 to 2.5 g/m$^2$. When it is at least 0.5 g/m$^2$, printing durability is excellent, and when it is no greater than 4.0 g/m$^2$, image reproduction and sensitivity are excellent.

The dry coat weight of the upper layer component is preferably in the range of 0.05 to 1.0 g/m$^2$, and more preferably in the range of 0.08 to 0.7 g/m$^2$. When it is at least 0.05 g/m$^2$ the development latitude and scratch resistance are excellent, and when it is no greater than 1.0 g/m$^2$ the sensitivity is excellent.

The dry coat weight of the lower layer and the upper layer in total is preferably in the range of 0.6 to 4.0 g/m$^2$, and more preferably in the range of 0.7 to 2.5 g/m$^2$. When it is at least 0.6 g/m$^2$ the printing durability is excellent, and when it is no greater than 4.0 g/m$^2$ the image reproduction and the sensitivity are excellent.

Support

A support is not particularly limited as long as it is a plate-shaped material having the required strength and durability, and dimensional stability, and examples thereof include paper, paper laminated with a plastic (e.g. polyethylene, polypropylene, polystyrene, etc.), a metal plate (e.g. aluminum, zinc, copper, etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal, etc.), and paper or a plastic film laminated or vapor-deposited with the above-mentioned metal.

Among them, in the present invention, a polyester film and an aluminum plate are preferable, and an aluminum plate, which has good dimensional stability and is relatively inexpensive, is particularly preferable. A desirable aluminum plate is a pure aluminum plate or an alloy plate containing aluminum as a main component and a trace amount of another element, or may be a plastic film laminated or vapor-deposited with aluminum. Examples of the other element contained in the aluminum alloy include silicon, iron, manganese, copper, magnesium, chromium, zinc, bismuth, nickel, and titanium. The content of the other element in the alloy is preferably no greater than 10 wt %.

A particularly desirable aluminum in the present invention is pure aluminum, but since it is difficult to produce completely pure aluminum in terms of refining techniques, it may contain a trace amount of another element.

Such an aluminum plate applied to the present invention is not specified in terms of composition, and an aluminum plate formed from a conventionally known, widely used material may appropriately be used. The aluminum plate used in the present invention preferably has a thickness of 0.1 to 0.6 mm, more preferably 0.15 to 0.4 mm, and particularly preferably 0.2 to 0.3 mm.

Such an aluminum plate may be subjected as necessary to a surface treatment such as a surface roughening treatment or an anodizing process. These surface treatments are briefly explained below.

Prior to roughening the surface of the aluminum plate, if desired, a degreasing treatment with, for example, a surfactant, an organic solvent, or an aqueous alkaline solution is carried out in order to remove rolling oil from the surface. The treatment to roughen the surface of the aluminum plate may be carried out by various methods such as, for example, a method involving mechanical roughening, a method involving electrochemical dissolution-roughening of the surface, and a method involving selective chemical dissolution of the surface. With regard to the mechanical method, a known method such as a ball grinding method, a brush grinding method, a blast grinding method, or a buff grinding method can be employed. With regard to the electrochemical roughening method, there is a method in which alternating current or direct current is used in a hydrochloric acid or nitric acid electrolytic solution. As disclosed in JP-A-54-63902, a method in which the two are combined can also be employed.

The aluminum plate whose surface has been thus roughened is subjected to an alkali etching treatment and a neutralization treatment as necessary and then, if desired, to an anodizing treatment in order to improve the water retention and the abrasion resistance of the surface. With regard to the electrolyte used for the anodizing treatment of the aluminum plate, various electrolytes for forming a porous oxide coating can be used and, in general, sulfuric acid, phosphoric acid, oxalic acid, chromic acid, or a mixture of these acids is used. The concentration of the electrolyte is determined according to the type of electrolyte as appropriate.

The conditions for the anodizing treatment depend on the type of electrolyte used and cannot, as a rule, be fixed but in general an electrolyte solution concentration of 1 to 80 wt %, a solution temperature of 5° C. to 70° C., a current density of 5 to 60 A/dm$^2$, a voltage of 1 to 100 V, and an electrolysis time of 10 sec to 5 min are preferable. The amount of anodized coating is preferably no greater than 1.0 g/m$^2$. When it is no greater than 1.0 g/m$^2$, the printing durability is excellent, the non-image areas of the lithographic printing plate become resistant to scratching, and the so-called 'scratch staining', which is caused by ink becoming attached to scratched areas during printing, can be suppressed.

After being subjected to the anodizing treatment, the surface of the aluminum is subjected as necessary to a hydrophilization treatment.

With regard to the hydrophilization treatment employed in the present invention, there are methods employing an alkali metal silicate (for example, an aqueous solution of sodium silicate) as disclosed in U.S. Pat. Nos. 2,714,066, 3,181,461, 3,280,734, and 3,902,734. In these methods, the support is immersed in an aqueous solution of sodium silicate or subjected to electrolysis. It is also possible to employ a method involving treatment with potassium fluorozirconate as disclosed in JP-B-36-22063, or with polyvinylphosphonic acid as disclosed in U.S. Pat. Nos. 3,276,868, 4,153,461, and 4,689,272.

Undercoat Layer

The lithographic printing plate precursor of the present invention may be provided as necessary between the support and the lower layer.

As undercoat layer components, various organic compounds may be used, and it may be selected among carboxymethylcellulose; dextrin; gum arabic; an amino group-containing phosphonic acid such as 2-aminoethylphosphonic acid; organic phosphonic acid such as phenylphosphonic acid, naphthylphosphonic acid, an alkylphosphonic acid, glycerophosphonic acid, methylenediphosphonic acid, or ethylenediphosphonic acid; organic phosphoric acid such as phenylphosphoric acid, naphthylphosphoric acid, an alkylphosphoric acid, or glycerophosphoric acid; an organic phosphinic acid such as phenylphosphinic acid, naphthylphosphinic acid, an alkylphosphinic acid, or glycerophosphinic acid; an amino acid such as glycine or β-alanine, and a hydroxy group-containing amine hydrochloride such as triethanolamine hydrochloride, etc. With regard to these undercoat layer components, one type may be used on its own or two or more types may be used as a mixture.

This organic undercoat layer may be provided by the following methods. That is, there is a method in which a solution formed by dissolving the above-mentioned organic compound in water, an organic solvent such as methanol, ethanol, or methyl ethyl ketone, or a mixed solvent thereof is applied onto an aluminum plate and dried or a method in which an aluminum plate is immersed in a solution formed by dissolving the above-mentioned organic compound in water, an organic solvent such as methanol, ethanol, or methyl ethyl ketone, or a mixed solvent thereof so as to make the above-mentioned compound adsorb thereon, followed by washing with water, etc. and drying to provide an organic undercoat layer. In the former method, a solution of the above-mentioned organic compound at a concentration of 0.005 to 10 wt % may be applied by various methods. In the latter method, the concentration of the solution is preferably 0.01 to 20 wt %, and more preferably 0.05 to 5 wt %, the immersion temperature is preferably 20° C. to 90° C., and more preferably 25° C. to 50° C., and the immersion time is preferably 0.1 sec. to 20 min., and more preferably 2 sec. to 1 min. With regard to the solution used therefor, its pH may be adjusted by a basic substance such as ammonia, triethylamine, or potassium hydroxide, or an acidic substance such as hydrochloric acid or phosphoric acid so that the pH is in the range of 1 to 12. A yellow dye may be added for the purpose of improving the tone reproduction properties of the image recording material.

The coverage of the organic undercoat layer is preferably 2 to 200 mg/m$^2$, and more preferably 5 to 100 mg/m$^2$. When the coverage is in the above-mentioned range, sufficient printing durability can be obtained. The lithographic printing plate precursor produced above is imagewise exposed and then developed.

Backcoat Layer

The reverse face of the support (the face of the support opposite to the face where there is a recording layer) of the lithographic printing plate precursor of the present invention is provided with a backcoat layer as necessary. As such a backcoat layer, a coating layer comprising an organic polymer compound described in JP-A-5-45885 or a coating layer comprising a metal oxide obtained by hydrolysis and polycondensation of an organic or inorganic metal compound described in JP-A-6-35174 is preferably used. Among these coating layers, use of a silicon alkoxy compound such as $Si(OCH_3)_4$, $Si(OC_2H_5)_4$, $Si(OC_3H_7)_4$, or $Si(OC_4H_9)_4$ is particularly preferable since starting materials are inexpensive and readily available and the metal oxide coating layer obtained therefrom has excellent developer resistance.

Process for Making Lithographic Printing Plate

The process for making a lithographic printing plate of the present invention comprises, in order, an exposure step of imagewise exposing the positive-working lithographic printing plate precursor for infrared laser and a development step of carrying out development using a developer.

Exposure Step

The process for making a lithographic printing plate of the present invention comprises an exposure step of imagewise exposing the positive-working lithographic printing plate precursor for infrared laser. In the exposure step, the printing plate precursor is exposed imagewise.

The actinic radiation light source used for imagewise exposure of the lithographic printing plate precursor is preferably a light source having an emission wavelength in the near-infrared to infrared region, and is more preferably a solid-state laser or a semiconductor laser. Among them, in the present invention, it is particularly preferable to carry out imagewise exposure using a solid-state laser or semiconductor laser that emits infrared radiation having a wavelength of 750 to 1,400 nm.

The laser output is preferably at least 100 mW, and in order to shorten the exposure time it is preferable to use a multi-beam laser device. It is also preferable for the exposure time per pixel to be within 20 μsec.

The energy with which a lithographic printing plate precursor is irradiated is preferably 10 to 300 mJ/cm$^2$. When in this range, curing progresses sufficiently, laser ablation can be suppressed, and damage to an image can be prevented.

Exposure in the present invention may be carried out by making light beams of the light source overlap. Overlap means that the sub-scanning pitch width is smaller than the beam diameter. When the beam diameter is expressed as a full width half maximum (FWHM) of the beam intensity, the overlap may be expressed quantitatively using for example FWHM/sub-scanning pitch width (overlap factor). In the present invention, this overlap factor is preferably at least 0.1.

The scanning method of the light source of exposure equipment that can be used in the present invention is not particularly limited, and a cylinder outer face scanning method, a cylinder inner face scanning method, a flat face scanning method, etc. may be used. The light source channel may be single channel or multi channel, but in the case of the cylinder outer face method multi channel is preferably used.

Development Step

The process for making a lithographic printing plate of the present invention comprises a development step of developing using an aqueous alkali solution (hereinafter, also called a 'developer' or a 'processing solution') comprising a betaine-based surfactant or a nonionic surfactant, the aqueous alkali solution having a pH of 8.5 to 10.8. When the pH is lower than 8.5 the developability of a non-image area is degraded, and when the pH exceeds 10.8 processing performance is affected by carbon dioxide in the air and is degraded. The pH of the developer is preferably 9.0 to 10.8, and more preferably 9.5 to 10.7.

From the viewpoint of improving processability, the developer comprises a betaine-based surfactant or a nonionic surfactant.

The betaine-based surfactant is preferably a compound represented by Formula <1> or a compound represented by Formula <2>.

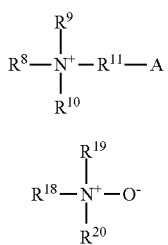

In Formula <1>, $R^8$ denotes an alkyl group having 1 to 24 carbon atoms, $R^9$ and $R^{19}$ independently denote a hydrogen atom or an alkyl group having 1 to 24 carbon atoms, $R^{11}$ denotes an alkylene group having 1 to 24 carbon atoms, and A denotes a carboxylic acid ion or a sulfonic acid ion. $R^8$ denotes an alkyl group having 1 to 24 carbon atoms and preferably an alkyl group having 1 to 20 carbon atoms, and more preferably an alkyl group having 1 to 16 carbon atoms. $R^9$ and $R^{19}$ preferably denote an alkyl group having 1 to 24 carbon atoms, more preferably an alkyl group, having 1 to 20 carbon atoms, and yet more preferably an alkyl group having 1 to 16 carbon atoms. $R^{11}$ denotes an alkylene group having 1 to 24 carbon atoms and preferably an alkylene group having 1 to 18 carbon atoms, more preferably an alkylene group having 1 to 12 carbon atoms, and yet more preferably an alkylene group having 1 to 6 carbon atoms.

In Formula <2>, $R^{18}$, $R^{19}$, and $R^{20}$ independently denote a hydrogen atom or an alkyl group having 1 to 24 carbon atoms, but not all of $R^{18}$, $R^{19}$, and $R^{20}$ are hydrogen atoms. $R^{18}$, $R^{19}$, and $R^{20}$ preferably denote an alkyl group having 1 to 24 carbon atoms, and more preferably an alkyl group having 1 to 20 atoms, and yet more preferably an alkyl group having 1 to 16 carbon atoms.

In Formula <1> above, the alkyl group denoted by $R^8$, $R^9$, or $R^{10}$ and the alkylene group denoted by $R^{11}$ may be straight-chain or branched-chain, may have a linking group in the chain, and may further have a substituent. As the linking group, one containing a hetero atom, such as an ester bond, an amide bond, or an ether bond, is preferable. Furthermore, as the substituent a hydroxy group, an ethylene oxide group, a phenyl group, an amide group, a halogen atom, etc. are preferable.

$R^8$, $R^9$, or $R^{10}$ may be linked to each other to form a ring. The form of linking to form a ring is preferably one that forms a 5-membered ring or a 6-membered ring, and the ring is particularly preferably a heterocycle containing a heteroatom. The heteroatom is preferably an oxygen atom, a nitrogen atom, or a sulfur atom. It is particularly preferably a cationic structure such as a substituted imidazole ring, a substituted imidazoline ring, or a substituted imidazolidine.

In the compound represented by Formula <1>, the sum total of the carbon atoms of $R^8$ to $R^{11}$ is preferably 8 to 25, and more preferably 11 to 21. When in this range, a hydrophobic portion is appropriate, and the solubility in an aqueous developer is excellent.

In Formula <2> above, the alkyl group denoted by $R^{18}$, $R^{19}$, or $R^{20}$ may be straight chain or branched chain, may have a linking group in the chain, and may further have a substituent. As the linking group, one containing a hetero atom, such as an ester bond, an amide bond, or an ether bond is preferable. Furthermore, as the substituent a hydroxy group, an ethylene oxide group, a phenyl group, an amide group, a halogen atom, etc. are preferable.

In the compound represented by Formula <2>, the sum total of the carbon atoms of $R^{18}$ to $R^{20}$ is preferably 8 to 22, and more preferably 10 to 20. When in this range, a hydrophobic portion is appropriate, and the solubility in an aqueous developer is excellent.

Furthermore, by adding an organic solvent such as an alcohol as a solubilizer, the solubility of the surfactant in an aqueous developer can be increased.

The total number of carbon atoms of the betaine-based surfactant can depend on the properties of a material used in the recording layer, in particular a binder. In the case of a highly hydrophilic binder, one in which the total number of carbon atoms is relatively small is preferable, and when the binder used has a low degree of hydrophilicity one in which the total number of carbon atoms is large tends to be preferable.

Preferred specific examples of the betaine-based surfactant that can be used in the developer are listed below, but the present invention is not limited thereto.

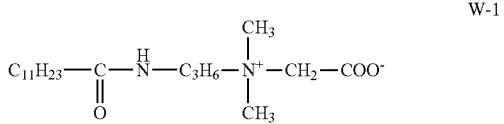

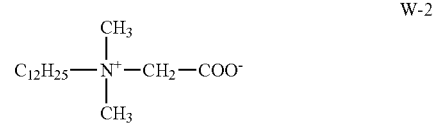

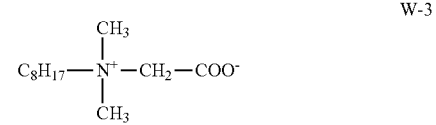

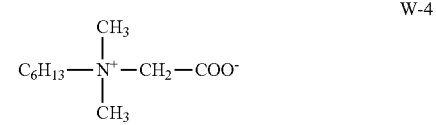

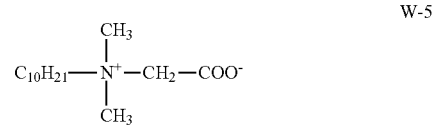

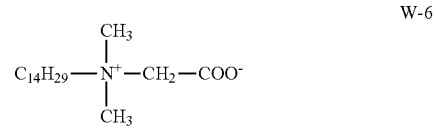

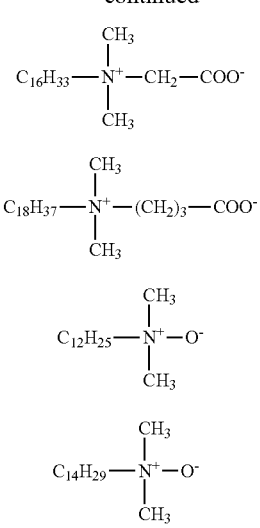

The content of the betaine-based surfactant in the developer is preferably 1 to 20 wt % of the developer, and more preferably 2 to 10 wt %. When the amount thereof added is in the above-mentioned range, the developability, the solubility of a recording layer component, and the printing durability of a printing plate are excellent.

Examples of the nonionic surfactant include a polyethylene glycol type higher alcohol ethylene oxide adduct, an alkylphenol ethylene oxide adduct, an aromatic compound polyalkylene glycol adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, sorbitol and sorbitan fatty acid esters, a sucrose fatty acid ester, a polyhydric alcohol alkyl ether, and an alkanolamine fatty acid amide.

The nonionic surfactant preferably comprises a nonionic aromatic ether-based surfactant, more preferably, benzene which may have non-dissociative substituent or naphthalene ethylene oxide and/or propylene oxide adduct. With regard to this surfactant, one type may be used on its own or two or more types may be used as a mixture.

The nonionic aromatic ether surfactant preferably comprises a compound represented by Formula (1-A) and/or Formula (1-B).

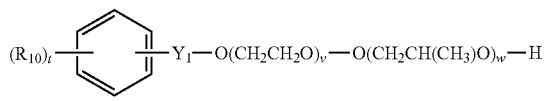
(1-A)

(1-B)

In the Formulae above, $R_{10}$ and $R_{20}$ independently denote an organic group having 1 to 100 carbon atoms; t and u independently denote 0, 1, or 2; $Y_1$ and $Y_2$ independently denote a single bond or an alkylene group having 1 to 10 carbon atoms; v and w independently denote an integer of 0 or 1 to 100 provided that v and w are not simultaneously 0 and when either v or w is 0 v and w are not 1, v' and w' independently denote an integer of 0 or 1 to 100 provided that v' and W are not simultaneously 0 and when either v' or w' is 0 v' and w' are not 1; when t denotes 2 and $R_{10}$ is an organic group having 1 to 100 carbon atoms, the $R_{10}$s may be identical to or different from each other, and the $R_{10}$s may together form a ring, and when u denotes 2 and $R_{20}$ is an organic group having 1 to 100 carbon atoms, the $R_{20}$s may be identical to or different from each other, and the $R_{20}$s may together form a ring.

Specific examples of the organic group having 1 to 100 carbon atoms include a saturated or unsaturated straight-chain or branched-chain aliphatic hydrocarbon group and an aromatic hydrocarbon group such as an alkyl group, an alkenyl group, an alkynyl group, an aryl group, and an aralkyl group.

Preferred examples of $R_{10}$ and $R_{20}$ include a straight-chain or branched alkyl group having 1 to 10 carbon atoms, an alkoxy group having 1 to 10 carbon atoms, an alkoxycarbonyl group, an N-alkylamino group, an N,N-dialkylamino group, an N-alkylcarbamoyl group, an acyloxy group, an acylamino group, a polyoxyalkylene chain with a number of repeating units of about 5 to 20, an aryl group having 6 to 20 carbon atoms, and an aryl group having bonded thereto a polyoxyalkylene chain with a number of repeating units of about 5 to 20.

In compounds of Formulae (1-A) and (1-B), the number of repeating units of the polyoxyethylene chain is preferably 3 to 50, and more preferably 5 to 30. The number of repeating units of the polyoxypropylene chain is preferably 0 to 10, and more preferably 0 to 5. A polyoxyethylene moiety and a polyoxypropylene moiety may form either a random or block copolymer.

Examples of compounds represented by Formula (1-A) include polyoxyethylene phenyl ether, polyoxyethylene methylphenyl ether, polyoxyethylene octylphenyl ether, and polyoxyethylene nonylphenyl ether.

Examples of compounds represented by Formula (1-B) include polyoxyethylene naphthyl ether, polyoxyethylene methylnaphthyl ether, polyoxyethylene octylnaphthyl ether, and polyoxyethylene nonylnaphthyl ether.

With regard to the nonionic aromatic ether-based surfactant, one type thereof may be used on its own in the developer or two or more types thereof may be used in combination.

The content of the nonionic surfactant such as the nonionic aromatic ether-based surfactant in the developer is preferably 1 to 20 wt % of the developer, and more preferably 2 to 10 wt %. When the amount thereof added is in the above-mentioned range, the developability, the solubility of a recording layer component, and the printing durability of a printing plate are good.

Examples of the nonionic aromatic ether-based surfactant represented by Formula (1-A) or (1-B) are shown below.

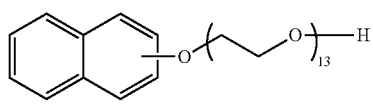
Y-1

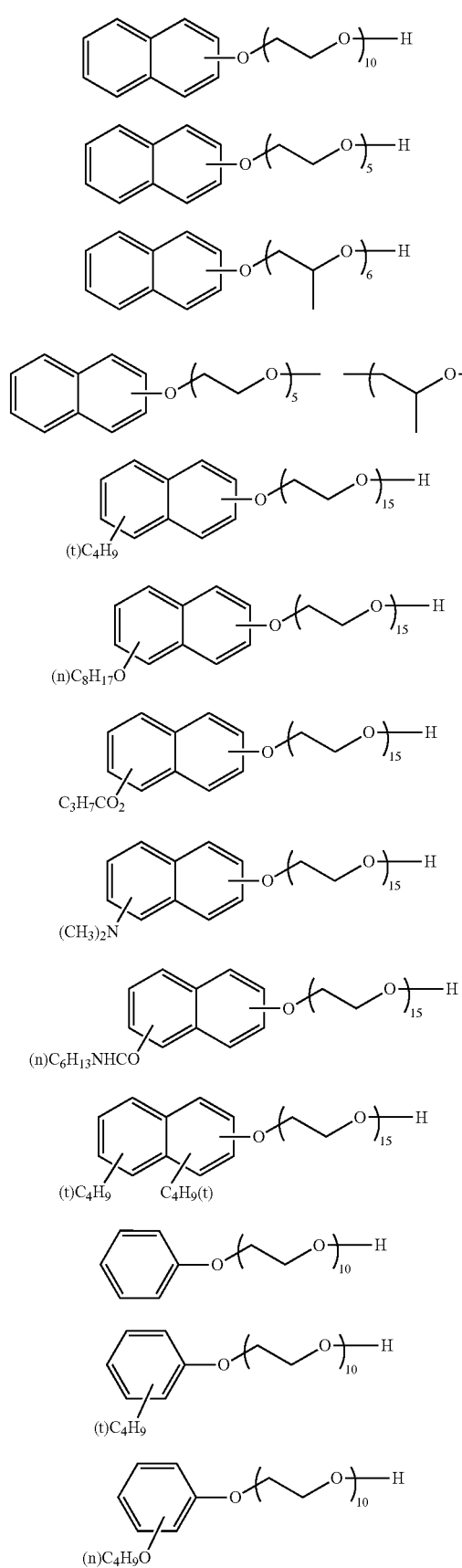
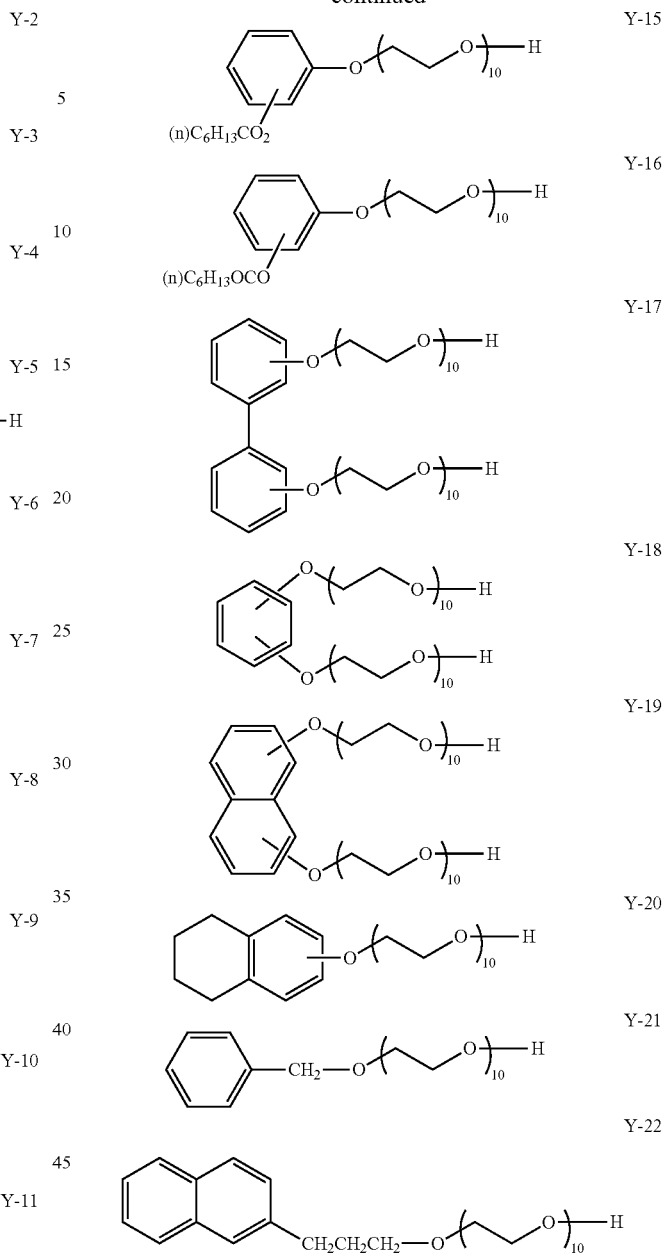

In the present invention, in addition to the above-mentioned betaine-based surfactant and nonionic surfactant, another anionic, cationic, or amphoteric surfactant may be contained.

As is well known in the surfactant field, an amphoteric surfactant is a compound having an anionic portion and a cationic portion in a single molecule, and includes amphoteric surfactants of the amino acid type, amine oxide type, etc.

In the present invention, from the viewpoint of stable solubility in water or turbidity, the surfactant, including the betaine-based surfactant and nonionic surfactant, preferably has an HLB value of at least 6, and more preferably at least 8.

In the present invention, the developer preferably comprises as the surfactant a nonionic surfactant or a betaine-based surfactant as a main component.

When a surfactant comprising a nonionic surfactant as a main component and additionally an anionic, cationic, or amphoteric surfactant is used, the content of the nonionic surfactant is preferably at least 50 wt % of the total amount of surfactant, more preferably at least 60 wt %, and yet more preferably at least 80 wt %. It is preferable that a nonionic aromatic ether-based surfactant is at least 50 wt % of the total amount of surfactant, more preferably at least 60 wt %, and yet more preferably at least 80 wt %.

When a surfactant comprising a betaine-based surfactant as a main component and additionally an anionic, cationic, nonionic, or other amphoteric surfactant is used, the content of the betaine-based surfactant is preferably at least 50 wt % of the total amount of surfactant, more preferably at least 60 wt %, and yet more preferably at least 80 wt %.

The surfactant may be used singly or in combination of two or more types.

The content of the surfactant in the developer is preferably 1 to 20 wt %, and more preferably 2 to 10 wt %.

As other surfactant, any of anionic, and nonionic surfactants may be used.

Examples of the anionic surfactant include a fatty acid salt, an abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylene alkylsulfophenyl ether salt, sodium N-methyl-N-oleyltaurine, a disodium N-alkylsulfosuccinic acid monoamide, a petroleum sulfonic acid salt, a sulfate ester salt, a phosphate ester salt, a partially saponified styrene-maleic anhydride copolymer, a partially saponified olefin-maleic anhydride copolymer, a naphthalenesulfonic acid salt formalin condensate, an aromatic sulfonic acid salt, and an aromatic substituted polyoxyethylenesulfonic acid salt. Among them, a dialkylsulfosuccinic acid salt, an alkylsulfate ester salt, or an alkylnaphthalenesulfonic acid salt is preferably used.

Examples of the cationic surfactant include an alkylamine salt, a quaternary ammonium salt, a polyoxyethylene alkylamine salt, and a polyethylene polyamine derivative.

In order to maintain the pH of the developer at 8.5 to 10.8, the addition of carbonate ion and bicarbonate ion is preferable. The presence of carbonate ion and bicarbonate ion as a buffer agent enables variation in pH to be suppressed even when the developer is used for a long period of time, thus suppressing degradation in developability due to variation in pH, the occurrence of development residue, etc. In order to make carbonate ion and bicarbonate ion be present in the developer, a carbonate salt and a bicarbonate salt may be added to the developer, or carbonate ion and bicarbonate ion may be formed by adjusting the pH after a carbonate salt or a bicarbonate salt is added. The carbonate salt and the bicarbonate salt are not particularly limited, but an alkali metal salt is preferable. As the alkali metal, lithium, sodium, and potassium can be cited, and sodium is particularly preferable. They may be used singly or in a combination of two or more types.

The total amount of carbonate and bicarbonate salts relative to the total weight of the developer is preferably 0.3 to 20 wt %, more preferably 0.5 to 10 wt %, and particularly preferably 1 to 5 wt %. When the total amount is at least 0.3 wt % developability and processability do not degrade; when it is no greater than 20 wt % it becomes difficult for a precipitate and crystals to form and, furthermore, it becomes difficult for a gel to form when neutralizing during developer waste solution processing, and no problems are caused in waste solution processing.

In order to finely adjust the alkali concentration or assist dissolution of a non-image area of a photosensitive layer, another alkali agent such as for example an organic alkali agent may be supplementarily used. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These other alkali agents may be used singly or in a combination of two or more types.

The developer may comprise, in addition to the above-mentioned compound, a wetting agent, a preservative, a chelating compound, an antifoaming agent, an organic acid, an organic solvent, an inorganic acid, an inorganic salt, etc. However, it is preferable not to add a water-soluble polymer compound since the surface of the plate easily becomes tacky, particularly when the developer is exhausted.

As the wetting agent, ethylene glycol, propylene glycol, triethylene glycol, butylene glycol, hexylene glycol, diethylene glycol, dipropylene glycol, glycerol, trimethylolpropane, digylcerol, etc. are suitably used. The wetting agent may be used singly or in a combination of two or more types. The wetting agent is preferably used in an amount of 0.1 to 5 wt % relative to the total weight of the developer.

As the preservative, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidinoguanidine derivative, a quaternary ammonium salt, a pyridine derivative, a quinoline derivative, a guanidine derivative, diazine, a triazole derivative, oxazole, an oxazine derivative, or a nitrobromoalcohol such as 2-bromo-2-nitropropane-1,3-diol, 1,1-dibromo-1-nitro-2-ethanol, or 1,1-dibromo-1-nitro-2-propanol is preferably used. It is preferable to use at least two types of preservatives in combination so as to exhibit efficacy toward various types of molds and microbes. The amount of preservative added is an amount that exhibits stable efficacy toward bacteria, molds, yeasts, etc., and depends on the type of bacteria, molds, or yeasts, but is preferably in the range of 0.01 to 4 wt % relative to the total weight of the developer.

As the chelating compound there can be cited, for example, ethylenediaminedisuccinate, ethylenediaminetetraacetic acid, the potassium salt thereof, or the sodium salt thereof; diethylenetriaminepentaacetic acid, the potassium salt thereof, or the sodium salt thereof; triethylenetetraminehexaacetic acid, the potassium salt thereof, or the sodium salt thereof; hydroxyethylethylenediaminetriacetic acid, the potassium salt thereof, or the sodium salt thereof; nitrilotriacetic acid or the sodium salt thereof; an organic phosphonic acid, for example, 1-hydroxyethane-1,1-diphosphonic acid, the potassium salt thereof, or the sodium salt thereof; or aminotri(methylenephosphonic acid), the potassium salt thereof, or the sodium salt thereof; or a phosphonoalkanetricarboxylic acid. An organic amine salt is also effective instead of the sodium salt or potassium salt of the chelating compound. As the chelating agent, one that is present stably in the developer composition and does not inhibit printing properties is selected. The amount thereof added is suitably 0.001 to 1.0 wt % relative to the total weight of the developer.

As the antifoaming agent, a normal silicone-based self emulsifying type, emulsifying type, nonionic, etc. compound may be used, and a compound having an HLB of no greater than 5 is preferable. A silicone antifoaming agent is preferable. Among them, an emulsifying dispersion type and solubilizing type may be used. The content of the antifoaming agent is suitably in the range of 0.001 to 1.0 wt % relative to the total weight of the developer.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and an organic phosphonic acid can be cited. The organic acid may also be used in the form of an alkali metal salt or an ammonium salt. The content of the organic acid relative to the total weight of the developer is preferably 0.01 to 5 wt % and more preferably 0.1 to 3 wt %.

Examples of the organic solvent include an aliphatic hydrocarbon (e.g. hexane, heptane, Isopar E, H, G (Esso Chemical Co., Ltd.), gasoline, or kerosene), an aromatic hydrocarbon (e.g. toluene or xylene), a halogenated hydrocarbon (e.g. methylene dichloride, ethylene dichloride, triclene, or monochlorobenzene), and a polar solvent.

Examples of the polar solvent include alcohols (methanol, ethanol, propanol, isopropanol, benzyl alcohol, ethylene glycol monomethyl ether, 2-ethoxyethanol, etc.), ketones (methyl ethyl ketone, cyclohexanone, etc.), esters (ethyl acetate, methyl lactate, propylene glycol monomethyl ether acetate, etc.), and others (triethyl phosphate, tricresyl phosphate, N-phenylethanolamine, N-phenyldiethanolamine, etc.).

Furthermore, when the organic solvent is insoluble in water, it may be employed by being solubilized in water using a surfactant, etc. In the case where the developer contains an organic solvent, the concentration of the organic solvent is preferably less than 40 wt % from the viewpoint of safety and inflammability.

As the inorganic acid and the inorganic salt, for example, phosphoric acid, metaphosphoric acid, monoammonium phosphate, diammonium phosphate, monosodium phosphate, disodium phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate can be cited. The content of the inorganic salt relative to the total weight of the developer is preferably 0.01 to 0.5 wt %.

The development temperature is not particularly limited as long as development is possible, but is preferably no greater than 60° C., and more preferably 15° C. to 40° C.

In development processing using an automatic processor, since the developer might be exhausted depending on the amount processed, the processing performance may be recovered by use of a replenisher or fresh developer. As one example of development and post-development treatments, there is a method in which alkali development is carried out, the alkali is removed by a water washing post-step, a gumming treatment is carried out in a gumming step, and drying is carried out in a drying step. As another example, a method in which water pre-washing, development, and gumming are carried out at the same time using an aqueous solution containing carbonate ion, bicarbonate ion, and a surfactant can be cited as a preferred example. Therefore although a water washing pre-step does not particularly need to be carried out, it is preferable to carry out a drying step after carrying out water pre-washing, development, and gumming by the use of one solution and, furthermore, with one bath. It is preferable to carry out drying subsequent to removal of extra developer using a squeegee roller, etc. after development.

The development step is preferably carried out by an automatic processor equipped with and a rubbing member. As the automatic processor there can be cited an automatic processor described in JP-A-2-220061 and JP-A-60-59351 in which a lithographic printing plate precursor after imagewise exposure is subjected to a rubbing treatment while being transported, and an automatic processor described in U.S. Pat. Nos. 5,148,746 and 5,568,768 and GB Patent No. 2,297,719 in which a lithographic printing plate precursor after imagewise exposure is placed on a cylinder and subjected to a rubbing treatment while rotating the cylinder. Among them, an automatic processor using a rotating brush roller as the rubbing member is particularly preferable.

The rotating brush roller may be appropriately selected by taking account, for example, of the scratch resistance of the image area and the robustness of the support of the lithographic printing plate precursor. As the rotating brush roller, a known rotating brush roller produced by implanting a brush material in a plastic or metal roller may be used. For example, a rotating brush roller described in JP-A-58-159533 and JP-A-3-100554, or a brush roller described in JU-B-62-167253 (JU-B denotes a Japanese examined utility model application publication), in which a metal or plastic groove-shaped member having implanted in rows therein a brush material is closely radially wrapped around a plastic or metal roller acting as a core, may be used.

As the brush material, a plastic fiber (for example, a polyester-based synthetic fiber such as polyethylene terephthalate or polybutylene terephthalate; a polyamide-based synthetic fiber such as nylon 6,6 or nylon 6,10; a polyacrylic synthetic fiber such as polyacrylonitrile or a polyalkyl (meth)acrylate; or a polyolefin-based synthetic fiber such as polypropylene or polystyrene) may be used. For example, a brush material having a fiber bristle diameter of 20 to 400 μm and a bristle length of 5 to 30 mm may preferably be used.

The external diameter of the rotating brush roller is preferably 30 to 200 mm, and the rotation speed at the tip of the brush which rubs the surface of the plate is preferable 0.1 to 5 m/sec. Plural number of the rotation brush rollers is preferably used.

The direction of rotation of the rotating brush roller may be the same direction or the opposite direction with respect to the transport direction of the lithographic printing plate precursor, but when two or more rotating brush rollers are used in an automatic processor, it is preferable that at least one rotating brush roller rotates in the same direction and at least one rotating brush roller rotates in the opposite direction. By such an arrangement, the recording layer in the non-image area can be more reliably removed. Furthermore, rocking the rotating brush roller in the rotational axis direction of the brush roller is also effective.

After the development step, the drying step is preferably provided consecutively or non-consecutively. Drying is conducted by hot air, infrared ray, far-infrared ray or the like.

One example of the structure of an automatic processor suitably used in the process for making a lithographic printing plate of the present invention is schematically illustrated in FIG. 1. The automatic processor shown in FIG. 1 basically comprises a development section 6 and a drying section 10, and a lithographic printing plate precursor 4 is subjected to development and gumming in a development tank 20 and drying in the drying section 10.

More specifically, this automatic processor comprises the development section 6, which develops the lithographic printing plate precursor 4, and the drying section 10, which dries the developed lithographic printing plate precursor 4. Provided within the development tank 20 of the development section 6 in sequence from upstream in the transport direction are a transport roller 22, a brush roller 24, and a squeegee roller 26, and provided therebetween at appropriate positions are backup rollers 28. The lithographic printing plate precursor 4 is immersed in a developer while being transported by the transport roller 22, and processed by removing a non-image area of the lithographic printing plate precursor 4 by rotating the brush roller 24. The processed lithographic printing plate precursor 4 is transported to the drying section 10 by a transport roller (transport-out roller).

The drying section 10 is provided, in sequence from upstream in the transport direction, with a guide roller 36 and a pair of skewer rollers 38. The drying section 10 is also provided with drying means such as hot air supplying means or heat generating means, which are not illustrated. The drying section 10 is provided with an outlet, and the lithographic printing plate precursor 4 that has been dried by the drying means is discharged through the outlet (not illustrated).

Furthermore, for the purpose of improving printing durability, etc., the printing plate after development may be heated under very severe conditions. The heating temperature is usually in the range of 200° C. to 500° C. When the temperature is low, a sufficient image strengthening effect cannot be obtained, and when it is too high, there might be problems such as degradation of the support or thermal decomposition of the image area.

The lithographic printing plate thus obtained is set in an offset printer, and suitably used for printing of a large number of sheets.

In accordance with the present invention, there can be provided a process for making a lithographic printing plate that enables the generation of development residue when processing a large amount to be suppressed and enables development of an aged lithographic printing plate precursor to be carried out stably, and a lithographic printing plate made by the above-mentioned making process.

EXAMPLES

The present invention is explained below by reference to Examples, but the scope of the present invention is not limited to these Examples. In addition, 'parts' and '%' mean 'parts by weight' and 'wt %' respectively unless otherwise specified.

Materials used in the Examples are shown below.

Component A
(a-1): styrene/acrylonitrile/methacrylic acid copolymer (copolymerization ratio 69 mol %/25 mol %/6 mol %, weight-average molecular weight 45,000)
(a-2): styrene/acrylonitrile copolymer (copolymerization ratio 73.5 mol %/26.5 mol %, SAN32, Bayer)

Component B
(b-1): N-phenylmaleimide/methacrylic acid/methacrylamide copolymer (copolymerization ratio 60 mol %/15 mol %/25 mol %, weight-average molecular weight=50,000)
(b-2) styrene/acrylonitrile/methacrylic acid copolymer (composition ratio 69 mol %/25 mol %/6 mol % weight-average molecular weight 45,000)

Component C
(c-1): cyanine dye A below

Alkali-soluble Resin

Polyurethane 1 below obtained by polymerization of isocyanate and diol at a molar ratio of 1:1 (weight-average molecular weight 36,000)
m,p-Cresol novolac 1 (m/p ratio=6/4, weight-average molecular weight 4,500, containing unreacted cresol at 0.8%)
Other Components
Ethyl Violet
Crystal Violet (Hodogaya Chemical Co., Ltd.)
Megafac F-177 (fluorine-based surfactant, DIC Corporation)
Solvents
3-Pentanone
Propylene glycol monomethyl ether 2-acetate
γ-Butyrolactone
Methyl ethyl ketone
1-Methoxy-2-propanol
Water Example 1-1

Preparation of Support
A 0.24 mm thick aluminum plate (an aluminum alloy containing Si: 0.06%, Fe: 0.30%, Cu: 0.014%, Mn: 0.001%, Mg: 0.001%, Zn: 0.001%, and Ti: 0.03%, the remainder being unavoidable impurities of Al) was subjected to the surface treatments shown below in succession.

An electrochemical roughening treatment was carried out continuously using an AC voltage of 60 Hz. An electrolyte here was a 10 g/liter aqueous solution of nitric acid (containing 5 g/liter of aluminum ion and 0.007% of ammonium ion), and the temperature was 80° C. After washing with water, the aluminum plate was subjected to an etching treatment at 32° C. by means of a spray using a caustic soda concentration of 26% and an aluminum ion concentration of 6.5%, thus dissolving 0.20 g/m² of the aluminum plate, and washing with water was carried out by means of a spray. Subsequently, it was subjected to a desmutting treatment by means of a spray using a 25% concentration aqueous solution of sulfuric acid (containing 0.5% of aluminum ion) at a temperature of 60° C., and washed with water by means of a spray.

An anodizing treatment was carried out using anodizing equipment employing a two-stage power supply electrolysis method. As an electrolyte that had been supplied to an electrolysis section, sulfuric acid was used. Subsequently, washing with water was carried out by means of a spray. The final amount of oxide film was 2.7 g/m².

An aluminum support obtained by the anodizing treatment was immersed in a treatment bath with a 1% aqueous solution of No. 3 sodium silicate at a temperature of 30° C. for 10 sec, thus carrying out an alkali metal silicate treatment (silicate treatment). Subsequently, washing with water was carried out by means of a spray.

The aluminum support that had been subjected to the alkali metal silicate treatment as described above was coated with an undercoat solution having the composition below and dried at 80° C. for 15 sec, thus giving a coating. The dry coverage of the coating was 15 mg/m².

Undercoat Solution

| β-Alanine | 0.5 parts |
| Methanol | 95 parts |
| Water | 5 parts |

Formation of Recording Layer

The support obtained as above was coated using a bar coater with lower layer coating solution 1 having the composition below at a coat weight of 1.5 g/m², then dried at 160° C. for 44 sec, and immediately cooled by means of cooled air at 17° C. to 20° C. until the temperature of the support became 35° C.

Lower Layer Coating Solution 1

| Water-insoluble and alkali-soluble resin (b-1) (N-phenylmaleimide/methacrylic acid/methacrylamide copolymer) | 5.21 parts |
| Cyanine dye A | 0.94 parts |
| Crystal Violet (Hodogaya Chemical Co., Ltd.) | 0.08 parts |
| Megafac F-177 (fluorine-based surfactant, DIC Corporation) | 0.05 parts |
| γ-Butyrolactone | 10 parts |
| Methyl ethyl ketone | 61 parts |
| 1-Methoxy-2-propanol | 14 parts |
| Water | 9.34 parts |

Subsequently, upper layer coating solution 1 having the composition below was applied using a bar coater at a coat weight of 0.5 g/m², drying was carried out at 130° C. for 40 sec, and gradual cooling was carried out by blowing at 20° C. to 26° C., thus giving a lithographic printing plate precursor of Example 1.

Upper Layer Coating Solution 1

| Styrene/acrylonitrile/methacrylic acid copolymer (composition ratio 69 mol %/ 25 mol %/6 mol %, weight-average molecular weight 45,000) | 20 parts |
| Alkali-soluble resin: polyurethane 1 above | 10 parts |
| Ethyl Violet | 0.03 parts |

-continued

| Megafac F-177 (fluorine-based surfactant, DIC Corporation) | 0.05 parts |
| 3-Pentanone | 60 parts |
| Propylene glycol monomethyl ether 2-acetate | 8 parts |

Examples 1-2 to 1-5, Comparative Examples 1-1 and 1-2, Examples 2-1 to 2-5, and Comparative Examples 2-1 and 2-2

Lithographic printing plate precursors of Examples 1-2 to 1-5, Comparative Examples 1-1 and 1-2, Examples 2-1 to 2-5, and Comparative Examples 2-1 and 2-2 were prepared in the same manner as in Example 1-1 except that the upper layer coating solution and the lower layer coating solution were changed to the compositions shown in Table 1 and Table 3.

Plate Making from Lithographic Printing Plate Precursor and Evaluation

The lithographic printing plate precursors of Examples 1-1 to 1-5 and the lithographic printing plate precursors of Comparative Examples 1-1 and 1-2 obtained were subjected to plate making by the exposure step and the development step of the plate making process of the present invention, and the evaluations shown below were carried out. Details of the exposure step and development step applied to each evaluation and the evaluation methods are as follows. The evaluation results are shown in Table 1.

1. Evaluation of Development Residue Adhering when Carrying Out High Volume Plate-making Exposure Step The lithographic printing plate precursors of Examples 1-1 to 1-5 and the lithographic printing plate precursors of Comparative Examples 1-1 and 1-2 obtained were cut into a size of 1,030 mm×800 mm and subjected to imagewise writing of a test pattern using an infrared semiconductor laser (Trendsetter 3244VX manufactured by Creo: equipped with a water-cooled 40 W infrared semiconductor laser) at an exposure energy of 150 mJ/cm².

Development Step

Subsequently, they were developed using specific developer A having the composition below by means of the automatic processor shown in FIG. 1 (development tank 25 L, plate transport speed 100 cm/min, one brush roller having an outer diameter of 50 mm and having implanted therein fibers of polybutylene terephthalate (bristle diameter: 200 μm, bristle length: 17 mm) and being rotated at 200 rpm in the same direction as the transport direction (peripheral speed at brush tip: 0.52 m/sec), drying temperature 80° C.), thus giving lithographic printing plates.

Composition of Specific Developer A

| Water | 796 parts |
| Sodium carbonate | 12.8 parts |
| Sodium bicarbonate | 7.0 parts |
| Sodium gluconate | 15.5 parts |
| Softazoline LPB-R (30% aqueous solution) | 154.0 parts |
| Softazoline LAO (30% aqueous solution) | 38.0 parts |
| Ethylenediamine disuccinate | 6.7 parts |
| pH 9.85 | |

The above-mentioned exposure treatment and development treatment were carried out for 5 days in succession with 100 plates/day. Subsequently, the automatic processor was stopped for 3 days and then restarted, and the exposure treatment and the development treatment were carried out under the same exposure and development conditions. The number of pieces of residue adhering to the entire non-image area formed on the first lithographic printing plate after restarting that had resulted from a deposit formed in the development tank of the automatic processor was counted by eye. The results are shown in Table 1.

2. Evaluation of Developability Using Lithographic Printing Plate Precursor Subjected to Forced Aging Exposure Step The lithographic printing plate precursors of Examples 1-1 to 1-5 and the lithographic printing plate precursors of Comparative Examples 1-1 and 1-2 obtained were cut into 500 mm×600 mm, and 30 sheets of lithographic printing plate precursors were layered while inserting protective paper inserts therebetween, thus giving a stack. Subsequently, the stack was sandwiched top and bottom with polyethylene-laminated cardboard and wrapped with aluminum kraft paper so as to give a barrier from the outside air. This package was placed in a climate-controlled cabinet (model FX224P, Kusumoto Chemicals, Ltd.) at 40° C. for 24 hours, and then power-exposed using a Trendsetter manufactured by Creo from 0 W to 10 W in steps of 0.5 W.

Development Step

Subsequently, development was carried out in the same manner as in the evaluation of development residue adhering, thus giving lithographic printing plates.

The developed lithographic printing plates were subjected to visual examination using a magnifying glass, and the power (W) at which the non-image area had been completely exposed was determined. Hereinafter, the exposure at which the non-image area was completely exposed is defined as the clear sensitivity. In this process, lithographic printing plate precursors that had not been placed in the climate-controlled cabinet at 40° C. were also subjected to determination of the clear sensitivity (W), and the difference in clear sensitivity between those placed and those not placed in the climate-controlled cabinet was determined.

The smaller the difference in clear sensitivity, the better the evaluation of developability. The results are shown in Table 1.

TABLE 1

| | | Example/Comparative Example | | | | | | |
|---|---|---|---|---|---|---|---|---|
| | | Ex. 1-1 | Ex. 1-2 | Ex. 1-3 | Ex. 1-4 | Ex. 1-5 | Comp. Ex. 1-1 | Comp. Ex. 1-2 |
| Upper layer coating solution composition (parts by weight) | | | | | | | | |
| Component A | (a-1) Styrene/acrylonitrile/ methacrylic acid copolymer | 20.0 | — | 20.0 | 20.0 | — | — | — |
| | (a-2) Styrene/acrylonitrile copolymer | — | 20.0 | — | — | 30.0 | — | — |
| Alkali-soluble resin | Polyurethane 1 | 10.0 | 10.0 | — | 10.0 | — | — | 30.0 |
| | m,p-Cresol novolac 1 | — | — | 10.0 | — | — | 30.0 | — |
| Others | Ethyl Violet | 0.03 | 0.03 | 0.03 | 0.03 | 0.03 | 0.03 | 0.03 |
| | Megafac F-177 | 0.05 | 0.05 | 0.05 | 0.05 | 0.05 | 0.05 | 0.05 |
| Solvent | 3-Pentanone | 60.0 | 60.0 | 60.0 | 60.0 | 60.0 | 60.0 | 60.0 |
| | Propylene glycol monomethyl ether 2-acetate | 8.0 | 8.0 | 8.0 | 8.0 | 8.0 | 8.0 | 8.0 |
| Lower layer coating solution composition (parts by weight) | | | | | | | | |
| Component B | (b-1) N-Phenylmaleimide/ methacrylic acid/ methacrylamide copolymer | 5.21 | 5.21 | 5.21 | — | 5.21 | 5.21 | 5.21 |
| | (b-2) Styrene/acrylonitrile/ methacrylic acid copolymer | — | — | — | 5.21 | — | — | — |
| Component C | (c-1) Cyanine dye A | 0.94 | 0.94 | 0.94 | 0.94 | 0.94 | 0.94 | 0.94 |
| Others | Crystal Violet | 0.08 | 0.08 | 0.08 | 0.08 | 0.08 | 0.08 | 0.08 |
| | Megafac F-177 | 0.05 | 0.05 | 0.05 | 0.05 | 0.05 | 0.05 | 0.05 |
| Solvent | γ-Butyrolactone | 10.0 | 10.0 | 10.0 | 10.0 | 10.0 | 10.0 | 10.0 |
| | Methyl ethyl ketone | 61.0 | 61.0 | 61.0 | 61.0 | 61.0 | 61.0 | 61.0 |
| | 1-Methoxy-2-propanol | 14.0 | 14.0 | 14.0 | 14.0 | 14.0 | 14.0 | 14.0 |
| | Water | 9.34 | 9.34 | 9.34 | 9.34 | 9.34 | 9.34 | 9.34 |

TABLE 1-continued

|  |  | Example/Comparative Example | | | | | | |
|---|---|---|---|---|---|---|---|---|
|  |  | Ex. 1-1 | Ex. 1-2 | Ex. 1-3 | Ex. 1-4 | Ex. 1-5 | Comp. Ex. 1-1 | Comp. Ex. 1-2 |
| Evaluation results | Evaluation of residue adhering (count) | 7 | 7 | 7 | 7 | 7 | 100 | 7 |
|  | Evaluation of developability after forced aging (W) | 1.0 | 1.0 | 1.0 | 1.0 | 1.0 | Developability NG Could not be evaluated | Image formation poor Could not be evaluated |

Examples 1-6 and 1-7 and Comparative Examples 1-3 and 1-4

Evaluation was carried out in the same manner as in Example 1-1 except that developer A used in Example 1-1 was changed to developers B to E as shown in Table 2. In Comparative Example 1-3, a developer obtained by diluting developer A as used in Example 1-1 so as to give a pH of 8.0 was used, and in Comparative Example 1-4 a developer obtained by adding KOH to developer A so as to give a pH of 13.0 was used. Evaluation results are shown in Table 2.

TABLE 2

|  |  | Example/Comparative Example | | | | |
|---|---|---|---|---|---|---|
|  |  | Ex. 1-1 | Ex. 1-6 | Ex. 1-7 | Comp. Ex. 1-3 | Comp. Ex. 1-4 |
|  |  | Developer composition (parts by weight) | | | | |
|  |  | Developer A | Developer B | Developer C | Developer D | Developer E |
| Surfactant | Softazoline LPB-R (30%) | 154.0 | 187.0 | — | Developer obtained by diluting with water developer A until pH 8.0 | Developer obtained by adding KOH to developer A until pH 13.0 |
|  | Softazoline LAO (30%) | 38.0 | — | — |  |  |
|  | Takesurf C-157-L (30%) | — | — | 250.0 |  |  |
|  | Water | 796.0 | 770.0 | 706.5 |  |  |
| Inorganic acid inorganic salt | Sodium carbonate | 12.8 | 14.3 | 14.3 |  |  |
|  | Sodium bicarbonate | 7.0 | 6.0 | 6.0 |  |  |
| Organic acid salt | Sodium citrate | — | 15.0 | 15.0 |  |  |
|  | Sodium gluconate | 15.5 | — | — |  |  |
| Chelate compound | Ethylenediamine disuccinate | 6.7 | 6.7 | 6.7 |  |  |
|  | pH | 9.85 | 9.91 | 9.4 | 8.0 | 13.0 |
| Evaluation results | Evaluation of residue adhering (count) | 7 | 7 | 7 | Developability NG | 5 |
|  | Evaluation of developability after forced aging (W) | 1.0 | 1.0 | 1.0 | Could not be evaluated | Image formation NG Could not be evaluated |

The surfactants described in Table 2 are as follows.
Softazoline LPB-R (30%): lauramidopropyl betaine aqueous solution (Kawaken Fine Chemicals Co., Ltd.)
Softazoline LAO (30%): lauramidopropylamine oxide aqueous solution (Kawaken Fine Chemicals Co., Ltd.)
Takesurf C-157-L: 30 wt % aqueous solution of amphoteric surfactant (W-2 above) (Takemoto Oil & Fat Co., Ltd.)

From the results of Table 1 and Table 2, it has been found that in accordance with the process for making a lithographic printing plate of the present invention, in spite of one bath processing using weakly alkaline developer, no residue is formed in the development tank, processability is excellent, and there is hardly any degradation in printing durability even when a developed plate is aged before use.

Examples 2-1 to 2-5 and Comparative Example 2-1 and 2-2

Evaluation was carried out in the same manner as in Example 1-1 except that the compositions of the upper layer coating solution and the lower layer coating solution were changed as shown in Table 3, the lithographic printing plate precursors of Examples 2-1 to 2-5 and the lithographic printing plate precursors of Comparative Examples 2-1 and 2-2 were used, and developer A was changed to developer F below. Evaluation results are shown in Table 3.

Composition of Developer F

| Water | 950 parts |
|---|---|
| Sodium carbonate | 12.8 parts |
| Sodium bicarbonate | 7.0 parts |
| Newcol B13 (nonionic surfactant, Nippon Nyukazai Co., Ltd.) | 30.0 parts |
| Ethylenediamine disuccinate | 6.7 parts |
| pH 9.89 | |

TABLE 3

| | | Example/Comparative Example | | | | | | |
|---|---|---|---|---|---|---|---|---|
| | | Ex. 2-1 | Ex. 2-2 | Ex. 2-3 | Ex. 2-4 | Ex. 2-5 | Comp. Ex. 2-1 | Comp. Ex. 2-2 |
| Upper layer coating solution composition (parts by weight) | | | | | | | | |
| Component A | (a-1) Styrene/acrylonitrile/methacrylic acid copolymer | 20.0 | — | 20.0 | 20.0 | — | — | — |
| | (a-2) Styrene/acrylonitrile copolymer | — | 20.0 | — | — | 30.0 | — | — |
| Alkali-soluble resin | Polyurethane 1 | 10.0 | 10.0 | — | 10.0 | — | — | 30.0 |
| | m,p-Cresol novolac 1 | — | — | 10.0 | — | — | 30.0 | — |
| Others | Ethyl Violet | 0.03 | 0.03 | 0.03 | 0.03 | 0.03 | 0.03 | 0.03 |
| | Megafac F-177 | 0.05 | 0.05 | 0.05 | 0.05 | 0.05 | 0.05 | 0.05 |
| Solvent | 3-Pentanone | 60.0 | 60.0 | 60.0 | 60.0 | 60.0 | 60.0 | 60.0 |
| | Propylene glycol monomethyl ether 2-acetate | 8.0 | 8.0 | 8.0 | 8.0 | 8.0 | 8.0 | 8.0 |
| Lower layer coating solution composition (parts by weight) | | | | | | | | |
| Component B | (b-1) N-Phenylmaleimide/methacrylic acid/methacrylamide copolymer | 5.21 | 5.21 | 5.21 | — | 5.21 | 5.21 | 5.21 |
| | (b-2) Styrene/acrylonitrile/methacrylic acid copolymer | — | — | — | 5.21 | — | — | — |
| Component C | (c-1) Cyanine dye A | 0.94 | 0.94 | 0.94 | 0.94 | 0.94 | 0.94 | 0.94 |
| Others | Crystal Violet | 0.08 | 0.08 | 0.08 | 0.08 | 0.08 | 0.08 | 0.08 |
| | Megafac F-177 | 0.05 | 0.05 | 0.05 | 0.05 | 0.05 | 0.05 | 0.05 |
| Solvent | γ-Butyrolactone | 10.0 | 10.0 | 10.0 | 10.0 | 10.0 | 10.0 | 10.0 |
| | Methyl ethyl ketone | 61.0 | 61.0 | 61.0 | 61.0 | 61.0 | 61.0 | 61.0 |
| | 1-Methoxy-2-propanol | 14.0 | 14.0 | 14.0 | 14.0 | 14.0 | 14.0 | 14.0 |
| | Water | 9.34 | 9.34 | 9.34 | 9.34 | 9.34 | 9.34 | 9.34 |
| Evaluation results | Evaluation of residue adhering (count) | 7 | 7 | 7 | 7 | 7 | 100 | 7 |
| | Evaluation of developability after forced aging (W) | 1.0 | 1.0 | 1.0 | 1.0 | 1.0 | Developability NG Could not be evaluated | Image formation poor Could not be evaluated |

Examples 2-6 and 2-7 and Comparative Examples 2-3 and 2-4

Evaluation was carried out by preparing a developer in the same manner as in Example 2-1 shown in Table 4 except that developer F used in Example 2-1 was changed as shown in Table 4. In Comparative Example 2-3, a developer obtained by diluting developer F as used in Example 2-1 so as to give a pH of 8.0 was used, and in Comparative Example 2-4 a developer obtained by adding KOH to developer F so as to give a pH of 13.0 was used.

Evaluation results are shown in Table 4.

TABLE 4

| | | Example/Comparative Example | | | | |
|---|---|---|---|---|---|---|
| | | Ex. 2-1 | Ex. 2-6 | Ex. 2-7 | Comp. Ex. 2-3 | Comp. Ex. 2-4 |
| | | Developer composition (parts by weight) | | | | |
| | | Developer F | Developer G | Developer H | Developer I | Developer J |
| Surfactant | Newcol B13 | 30.0 | 50.0 | — | Developer obtained by diluting specific developer F with water until pH 8.0 | Developer obtained by adding KOH to specific developer F until pH 13.0 |
| | Eleminol MON (47%) | — | 50.0 | — | | |
| | Compound 1 below | — | — | 25.0 | | |
| | Compound 2 below | — | — | 25.0 | | |
| | Water | 950.0 | 870.0 | 940.0 | | |
| Inorganic acid inorganic salt | Sodium carbonate | 12.8 | 12.8 | 12.8 | | |
| | Sodium bicarbonate | 7.0 | 7.0 | 7.0 | | |
| Organic acid salt | Sodium citrate | — | 15.0 | — | | |
| | Sodium gluconate | — | — | — | | |
| Chelate compound | Ethylenediamine disuccinate | 6.7 | 6.7 | 6.7 | | |
| | PH | 9.89 | 9.82 | 9.89 | 8.0 | 13.0 |
| Evaluation results | Evaluation of residue adhering (count) | 7 | 7 | 7 | Develop ability NG | 5 |
| | Evaluation of developability after forced aging (W) | 1.0 | 1.0 | 1.0 | Could not be evaluated | Image formation NG Could not be evaluated |

Surfactants described in Table 4 are as follows.

Newcol B13: nonionic surfactant (polyoxyethylene aryl ether, HLB=16.0) (Nippon Nyukazai Co., Ltd.)

The chemical structures of nonionic surfactants used as compound 1 and compound 2 are shown below.

Compound 1

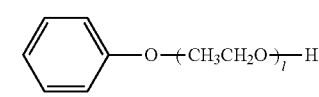

l = 13-28

Compound 2

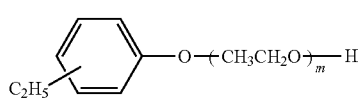

m = 12-26

From the results of Table 3 and Table 4, it has been found that in accordance with the process for making a lithographic printing plate of the present invention, in spite of one bath processing using weakly alkaline developer, no residue is formed in the development tank, processability is excellent, and there is hardly any degradation in printing durability even when a developed plate is aged before use.

What is claimed is:

1. A process for making a lithographic printing plate, comprising in sequence:

an exposure step of imagewise exposing by means of an infrared laser a lithographic printing plate precursor that has provided above a support a positive-working recording layer comprising (Component A) a (meth)acrylonitrile-derived monomer unit- and styrene-derived monomer unit-containing copolymer, (Component B) a water-insoluble and alkali-soluble resin, and (Component C) an infrared absorbing agent; and a development step of developing, using an aqueous alkali solution comprising a betaine-based surfactant or a nonionic surfactant, the aqueous alkali solution having a pH of 8.5 to 10.8, by removing an exposed area of the positive-working recording layer whose solubility in aqueous alkali solution has been increased by the exposure, wherein:

the positive-working recording layer is a layer comprising an upper layer comprising the Component A and a lower layer comprising the Component B and the Component C; and the Component A has a content of 40 to 75 wt % relative to the total solids content by weight of the upper layer excluding volatile components.

2. The process for making a lithographic printing plate according to claim 1, wherein the betaine-based surfactant comprises a compound represented by Formula <1> and/or a compound represented by Formula <2>,

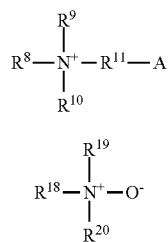  <1>

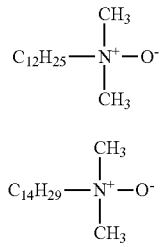  <2> wherein R⁸ denotes an alkyl group having 1 to 24 carbon atoms, $R^9$ and $R^{10}$ independently denote a hydrogen atom or an alkyl group having 1 to 24 carbon atoms, $R^{11}$ denotes an alkylene group having 1 to 24 carbon atoms, and A denotes a carboxylate ion or a sulfonate ion, and $R^{18}$, $R^{19}$, and $R^{20}$ independently denote a hydrogen atom or an alkyl group having 1 to 24 carbon atoms provided that not all of $R^{18}$, $R^{19}$, and $R^{20}$ are hydrogen atoms.

3. The process for making a lithographic printing plate according to claim 1, wherein the betaine-based surfactant comprises at least one of the compounds represented by Formula (W-1) to Formula (W-10):

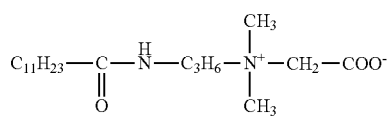  W-1

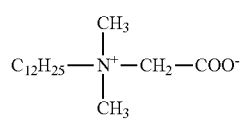  W-2

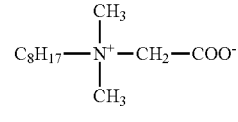  W-3

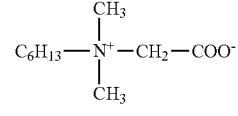  W-4

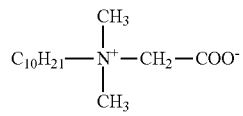  W-5

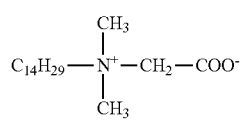  W-6

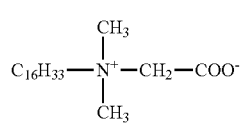  W-7

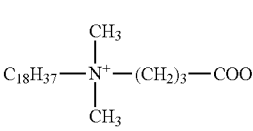  W-8

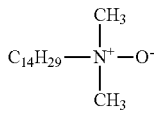  W-9

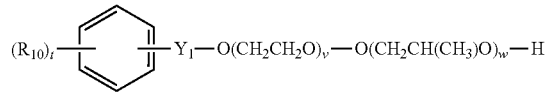  W-10

4. The process for making a lithographic printing plate according to claim 1, wherein the nonionic surfactant comprises a nonionic aromatic ether-based surfactant.

5. The process for making a lithographic printing plate according to claim 1, wherein the nonionic surfactant comprises a compound represented by Formula (1-A) and/or Formula (1-B),

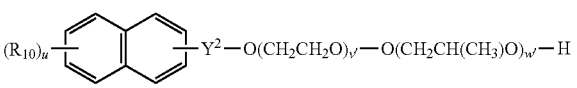

wherein $R_{10}$ and $R_{20}$ independently denote an organic group having 1 to 100 carbon atoms; t and u independently denote 0, 1, or 2; $Y_1$ and $Y_2$ independently denote a single bond or an alkylene group having 1 to 10 carbon atoms; v and w independently denote an integer of 0 or 1 to 100 provided that v and w are not simultaneously 0 and when either v or w is 0 v and w are not 1; v' and w' independently denote an integer of 0 or 1 to 100 provided that v' and w' are not simultaneously 0 and when either v' or w' is 0 v' and w' are not 1; when t denotes 2 and $R_{10}$ is an organic group having 1 to 100 carbon atoms, the $R_{10}$s may be identical to or different from each other, and the $R_{10}$s may together form a ring, and when u denotes 2 and $R_{20}$ is an organic group having 1 to 100 carbon atoms, the $R_{20}$s may be identical to or different from each other, and the $R_{20}$s may together form a ring.

6. The process for making a lithographic printing plate according to claim 1, wherein the aqueous alkali solution comprises a combination of carbonate ion and bicarbonate ion.

7. The process for making a lithographic printing plate according to claim 1, wherein the development step is a step of carrying out development and gumming with a single bath.

8. The process for making a lithographic printing plate according to claim 1, wherein the aqueous alkali solution does not comprise a water-soluble polymer compound.

9. The process for making a lithographic printing plate according to claim 1, wherein a water washing step is not carried out either before or after the development step.

10. The process for making a lithographic printing plate according claim 1, wherein the upper layer further comprises an alkali-soluble resin.

11. The process for making a lithographic printing plate according to claim 1, wherein the alkali-soluble resin is selected from the group consisting of an alkali-soluble polyurethane resin, an alkali-soluble phenolic resin, and an alkali-soluble resin having a urea bond in a side chain.

12. The process for making a lithographic printing plate according to claim 1, wherein the Component B has a content of 20 to 98 wt % relative to the total solids content by weight of the lower layer excluding volatile components.

13. The process for making a lithographic printing plate according to claim 1, wherein the Component C has a content of 0.01 to 50 wt % relative to the total solids content by weight of the lower layer excluding volatile components.

14. The process for making a lithographic printing plate according to claim 1, wherein the proportion of the (meth)acrylonitrile-derived monomer unit in the Component A is 10 to 40 mole %, and the proportion of the styrene-derived monomer unit is 55 to 85 mole %.

15. The process for making a lithographic printing plate according to claim 1, wherein the Component B is a copolymer comprising an N-substituted maleimide-derived monomer unit, a (meth)acrylamide-derived monomer unit, and a (meth)acrylic acid-derived monomer unit.

16. The process for making a lithographic printing plate according claim 1, wherein the Component C is a cyanine dye.

17. The process for making a lithographic printing plate according to claim 1, wherein the aqueous alkali solution comprises an organic acid and/or an organic acid salt.

18. The process for making a lithographic printing plate according to claim 1, wherein the Component A is a copolymer consisting of a (meth)acrylonitrile-derived monomer unit and a styrene-derived monomer unit, or a copolymer consisting of a (meth)acrylonitrile-derived monomer unit, a styrene-derived monomer unit, and a third component-derived monomer unit, and the third component is selected from the group consisting of acrylic acid, methacrylic acid, and compounds represented by the formulae below:

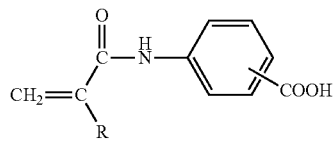

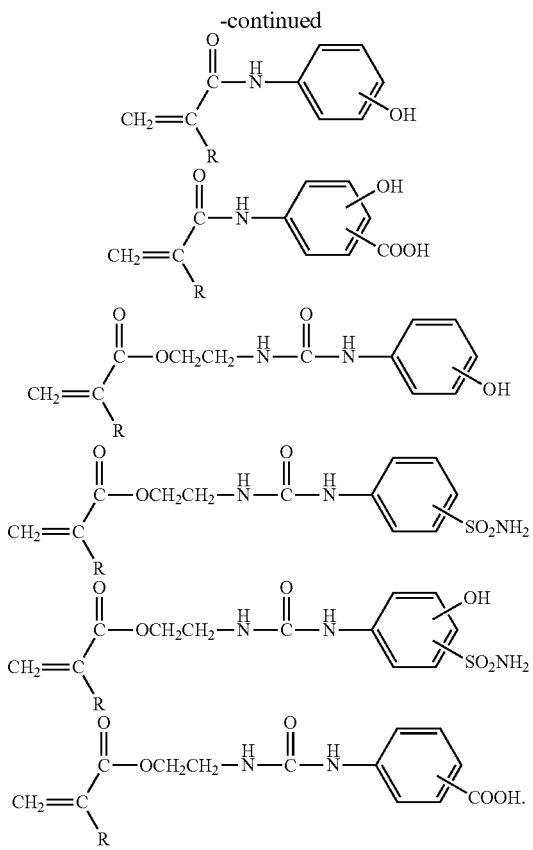

19. The process for making a lithographic printing plate according to claim 10, wherein the alkali-soluble resin of the upper layer is an alkali-soluble polyurethane resin and/or an alkali-soluble phenolic resin.

20. The process for making a lithographic printing plate according claim 1, wherein the upper layer does not comprise the Component C.

21. The process for making a lithographic printing plate according claim 1, wherein the lower layer does not comprise the Component A.

\* \* \* \* \*